United States Patent [19]

Kurosawa et al.

[11] Patent Number: 5,182,615
[45] Date of Patent: Jan. 26, 1993

[54] EXPOSURE APPARATUS

[75] Inventors: Hiroshi Kurosawa, Atsugi; Koji Uda, Yokohama; Kunitaka Ozawa, Isehara; Shunichi Uzawa, Tokyo; Nobutoshi Mizusawa, Yamato; Shigeyuki Suda, Yokohama; Noriyuki Nose; Takao Kariya, both of Tokyo, all of Japan

[73] Assignee: Canon Kabushiki Kaisha, Tokyo, Japan

[21] Appl. No.: 563,420

[22] Filed: Aug. 7, 1990

[30] Foreign Application Priority Data

Aug. 7, 1989 [JP] Japan .................................. 1-202775
Aug. 31, 1989 [JP] Japan .................................. 1-223293
Oct. 3, 1989 [JP] Japan .................................. 1-257077

[51] Int. Cl.$^5$ .............................................. G01B 11/00
[52] U.S. Cl. ................................... 356/400; 356/401; 250/548
[58] Field of Search ................................... 356/399–401; 355/53, 55; 250/548

[56] References Cited

U.S. PATENT DOCUMENTS 4,553,834 11/1985 Ayata et al. ........................... 355/53
4,629,313 12/1986 Tanimoto ............................ 356/401
4,676,630 6/1987 Matsushita et al. ................. 355/53
4,704,033 11/1987 Fay et al. ........................... 356/363
4,748,477 5/1988 Isohata et al. ....................... 355/53
4,998,134 3/1991 Isohata et al. ....................... 355/53

FOREIGN PATENT DOCUMENTS 0226905 7/1987 European Pat. Off. .

Primary Examiner—F. L. Evans
Assistant Examiner—K. P. Hantis
Attorney, Agent, or Firm—Fitzpatrick, Cella, Harper & Scinto

[57] ABSTRACT

An exposure apparatus for printing a pattern of a mask to a wafer includes a mask moving mechanism for moving the mask; a wafer moving mechanism or moving the wafer along a predetermined movement coordinate; a measuring system for measuring an error with respect to the movement coordinate, resulting from the movement of the mask by the mask moving mechanism; and a memorizing device for memorizing a data table prepared on the basis of the error measured by the measuring system; wherein the wafer moving mechanism uses the data in the data table when it moves the wafer for positioning of the wafer with respect to the mask.

12 Claims, 23 Drawing Sheets

EXPOSURE APPARATUS

FIELD OF THE INVENTION AND RELATED ART

This invention relates to an exposure apparatus for use in the manufacture of semiconductor microcircuit devices for printing a pattern formed on a mask onto a semiconductor wafer. More particularly, the invention is concerned with an exposure apparatus suitably usable for exposing a semiconductor wafer to a pattern of a mask with X-rays contained in a synchrotron radiation beam.

In the field of manufacture of semiconductor devices, exposure apparatuses are used to expose a wafer to a mask with a radiation beam such as light having a predetermined wavelength or wavelengths, a laser beam or X-rays, so as to print the pattern of the mask to the wafer. An example of such an exposure apparatus is disclosed in Japanese Laid-Open Patent Application, Laid-Open No. Sho 62-108523, which is called a "stepper" wherein a circuit pattern of a mask is projected in a reduced scale onto a wafer through a reduction projection lens and, while moving the wafer stepwise, images of the circuit pattern are printed on different zones of the wafer.

As for the alignment system for a mask and a wafer in such stepper type exposure apparatuses a die-by-die alignment method and a global alignment method are known. The former is such a method wherein the mask-to-wafer alignment is effected with respect to each of different zones (shot areas) on the wafer and, after completion of alignment of one zone, the exposure of that zone is effected. The latter is such method wherein the mask-to-wafer alignment measurement is effected with respect to some sample shot areas of one wafer and, on the basis of the obtained data, an optimum exposure position with respect to each of the remaining shot areas is calculated. After this, the exposures of all the shot areas of the wafer are executed in a predetermined sequence, without effecting further alignment measurement.

SUMMARY OF THE INVENTION

The die-by-die alignment method assures good registration precision with respect to each shot area, but the throughput is decreased. Further, there is a disadvantage of accumulation of chip (shot) rotation. On the other hand, the global alignment method can assure higher throughput as compared with the die-by-die alignment method. However, there is a possibility of lower registration precision in each shot area, as compared with the die-by-die alignment method.

When a wafer is to be exposed in accordance with the global alignment method, the sequence will be such as shown in FIG. 5. At step 504 in this sequence, a wafer stage and a mask stage are moved without measuring the state of alignment of a mask and a wafer. Hereinafter, such movement will be referred to as "blind feeding". If in this blind feeding the coordinate axis inherent to the mask stage is not aligned with that inherent to the wafer stage, there occurs a registration error between the mask and the wafer. Conventionally, no particularly attention has been paid to such an error because the amount of blind feeding is small and, naturally, no specific measure has been taken therefor. However, in consideration of recent requirement for further miniaturization of a circuit pattern, such error cannot be disregarded.

Accordingly, it is an object of the present invention to attain, in such an exposure apparatus, enhanced registration precision in the mask-to-wafer alignment and enhanced throughput of the exposure apparatus.

In accordance with an aspect of the present invention to achieve this object, an exposure apparatus for projecting a pattern of a mask to a plurality of exposure zones on a wafer in sequence, is equipped with means for holding the mask and means for holding the wafer, wherein a data table is prepared by measuring, beforehand, a positioning error as viewed from the wafer side and caused in relation to the positioning of the mask and wherein, upon relative positioning of the mask and the wafer, the prepared data table is referred to so as to control the positioning of the wafer.

Generally, the positioning of a mask includes moving the mask in a rotational direction, and usually the positioning error as observed from the wafer side is attributable to such motion in the rotational direction.

As an example, the positioning error with reference to the wafer side may be measured by projecting light from a light emitting element, whose position is fixed with respect to a mask held by the mask holding means, and by detecting and processing an output of a light receiving element, receiving the light from the light emitting element and having a position fixed with respect to a wafer held by the wafer holding means.

When the relative positioning of a mask and a wafer is to be made in accordance with the global alignment method, for enhancement of throughput, the alignment measurement is effected with respect to some shot areas on the wafer and, on the basis of such alignment measurement, the positioning or blind feeding is effected with respect to the remaining shot areas. Usually, such positioning requires inclusion of correction such as rotationally moving the mask in a $\theta$ direction in accordance with each shot area. When observed from the wafer side, this causes a change in the position of the mask with respect to the X and Y directions, which change results in an error. However, in the present invention, such an error is measured beforehand to prepare a data table, and the wafer positioning is executed with the amount of feeding determined in accordance with each exposure zone, while taking into account the data table. As a result, such error can be corrected and accurate alignment is attained.

By the way, in the recent trend of further miniaturization of a circuit pattern, light of the ultraviolet region having been conventionally used as exposure light has required replacement by a shorter wavelength region. As an example of the new type of light source for transfer of a circuit pattern, use of light of synchrotron soft X-rays has been proposed. A representative example of the exposure apparatus that uses such soft X-rays is a proximity exposure type exposure apparatus wherein a mask and a wafer are disposed close to each other, whereby a printed pattern of one-to-one magnification is obtained.

In such a proximity exposure type, however, there is a problem with respect to the mounting and demounting of a wafer before start of exposure and after the exposure and also with respect to the mounting and demounting of a mask at the time of mask replacement. Namely, since the clearance between the mask and the wafer is very small, it is difficult to execute these operations at a position at which the exposure is to be effected actually. As a solution for this, a method may be considered wherein a mask stage is moved away from the exposure position, in a direction parallel to the wafer surface, to a site whereat the wafer is not opposed to the mask, and after this the mounting/demounting of the mask and the wafer is executed. In this method, however, when the position of the wafer stage is to be measured by using a laser interferometer, throughout the whole range of the stroke of the wafer stage, a large reflection mirror has to be mounted to the wafer stage for reflection of laser light. This raises a problem of difficulty in the mirror machining.

Accordingly, it is another object of the present invention to provide an exposure apparatus by which at least one of these problems can be solved.

In accordance with an aspect of the present invention, to achieve this object, an exposure apparatus is equipped with a wafer stage for holding a wafer, a stage position measuring means for measuring the position of the wafer stage by use of a laser interferometer, a stage drive control means for controllably driving the wafer stage on the basis of an output of the stage position measuring means, and an alignment measuring means for optically detecting relative positional deviation of a mask and the wafer, wherein on the basis of an output of the alignment measuring means, the position of the wafer is adjusted with respect to the mask under the influence of the stage position measuring means and the stage drive control means and, thereafter, a pattern of the mask is transferred by exposure to the wafer, an important feature residing in that the exposure apparatus is provided with a combination of light source means and light receiving means, the positional relationship of which is changeable with the movement of the wafer stage, the light receiving means being adapted to detect the optical axis position of light emitted by the light source means, and also provided with means for detecting the position of the wafer stage by use of the light source means and the light receiving means at the time of a start of measurement and when the measurement through the stage position measuring means is recovered.

The light source means may be fixed to the same rigid member such as a housing of the apparatus, and the light receiving means may include a reflection mirror provided on the wafer stage, for reflecting laser light of the laser interferometer, and a light receiving element fixed to the same rigid member. Also, the light receiving means may be arranged to receive light emitted from the alignment measuring means.

In such structure, the stage position measuring means may include a mirror fixed to the wafer stage for reflection of light from the laser interferometer, and generally such a mirror has a size corresponding only to the stroke necessary for the wafer exposure. Therefore, if the wafer stage is retracted to a position (mask position) facing the mask, for execution of mounting or demounting of the wafer and/or the mask, measurement of the stage position through the laser interferometer is interrupted. However, after the mounting or demounting of the wafer and/or the mask, the wafer stage is moved back to the mask position and, then, the axis of light is projected from a light source such as a light emitting device (laser diode) fixed to the housing and the axis of light projected is received by a light receiving element (photosensitive device). By this, data necessary for reproducing the wafer stage position is obtained and, on the basis of this, the wafer stage position can be reproduced. As a result, even after completion of mounting or demounting of the wafer and/or the mask, it is possible to hold the wafer stage position the same as assumed before the mounting or demounting. Alternatively, it is possible to execute the exposure in accordance with the drive control of the wafer stage, which is equivalent to that in which the wafer stage position before the mounting or demounting is held.

In another aspect, in the field of exposure apparatuses for use in the manufacture of semiconductor devices, the relative alignment of a mask and a wafer is one important factor with respect to ensuring improved performance. Particularly, as for alignment systems employed in recent exposure apparatuses, submicron alignment accuracies or more strict accuracies are required in consideration of the demand for higher degree of integration of semiconductor devices. In many types of alignment systems, features called "alignment patterns" are provided on a mask and a wafer and, by utilizing positional information obtainable from these patterns, the mask and the wafer are aligned with each other.

By way of example, FIG. 23 shows an alignment detecting mechanism of a type for detecting the gravity center of reflection light, that uses diffraction gratings as the alignment patterns. In the drawing, denoted at 2101 is a semiconductor laser (light emitting element), at 2102 is a collimator lens for transforming the light produced from the semiconductor laser 2101 into parallel light, and at 2103 is a half mirror. The half mirror 2103 serves to reflect the light from the semiconductor laser 2101 toward a mask 2104 and a wafer 2105. Also, the half mirror serves to transmit light from the mask 2104 or the wafer 2105.

The mask 2104 comprises a film member made of a material such as polyimide, for example, on which a semiconductor pattern and an alignment mark 2104a are formed with a material such as gold, for example. The alignment mark 2104a formed on the mask 2104 surface is irradiated with the light reflected from the half mirror 2103. The silicon wafer 2105 has a semiconductor pattern and an alignment mark 2105a formed thereon. Accumulation type photoelectric converting element 2106 comprises a charge coupled device (CCD), for example, and receives such light coming by way of the alignment mark 2105a of the wafer 2105 and the alignment mark 2104a of the mask 2104 and having alignment information.

Denoted at 2107 is an LD (laser diode) driver for driving the semiconductor laser 2101 at a light quantity as set externally. Sensor driver 2108 drives and controls the photoelectric converting element 2106 at an accumulation time as set externally. Signal processor 2109 serves to process the output of the photoelectric converting element 2106 and to calculate, for example, the center of gravity of the light having the alignment information as described above. Displacement gauge 2110 serves to measure relative vibration of the mask 2104 and the wafer 2105, and it comprises an electrostatic capacitance displacement gauge, for example. Microcomputer 2111 receives the output of the displacement gauge 2110 and serves to set the light quantity of the semiconductor laser 2101, on the basis of the relative vibration of the mask 2104 and the wafer 2105, and also to set the accumulation time of the photoelectric converting element 2106, and supplies corresponding signals to the LD driver 2107 and the sensor driver 2108.

In such an alignment system, if the position or the angle of incidence of the beam spot projected from the light source 2101 to the mask 2104 surface or the wafer 2105 surface is not adjusted correctly, then the following problems arise.

(1) The luminance of reflection light imaged on the CCD 2106 decreases, which results in a decrease in the signal-to-noise ratio.

(2) Since the center of the projected beam shifts, the gravity center of the beam spot images upon the CCD 2106 displaces. This results in deterioration of measured alignment data, as obtainable through the signal processor 2109.

This means that, in order to attain alignment precision of submicron order or lower, it is necessary to adjust the position and the angle of incidence of the alignment measuring beam, projected by the alignment measuring optical system, with respect to an associated alignment mark.

Accordingly, it is a further object of the present invention to provide an exposure apparatus by which the position of incidence of an alignment measuring beam upon an article, being examined, can be controlled accurately without causing a decrease in the throughput of the exposure apparatus.

In accordance with a further aspect of the present invention, to achieve this object, a method of measuring the position of a spot of light beam projected to a mask or a wafer, is proposed wherein the light beam passed through the mask is directly received by a sensor mounted to a stage and, from an output signal of the sensor and the data, obtainable through a stage position measuring system, the position of the beam spot is calculated. This ensures accurate measurement of the position of the spot of a projected light beam.

Complementing may be made to the measurement by executing the position measurement at several sites in an area through which the alignment measuring optical system can be displaced, and it is possible to prepare a table that shows the relationship between the displaced position of the alignment measuring optical system and the position of the beam spot.

When the alignment measuring system is to be operated in an ordinary sequence, it may be displaced while referring to the prepared table. This makes it possible to avoid the necessity of executing the beam spot position measurement each time the alignment measuring system is displaced. Thus, it is possible to control the beam spot position accurately and quickly.

Further, it is a general object of the present invention to provide an exposure apparatus which assures high-precision pattern printing, with the use of a light source means providing a radiation beam and a photosensor means mounted to a wafer holding means.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
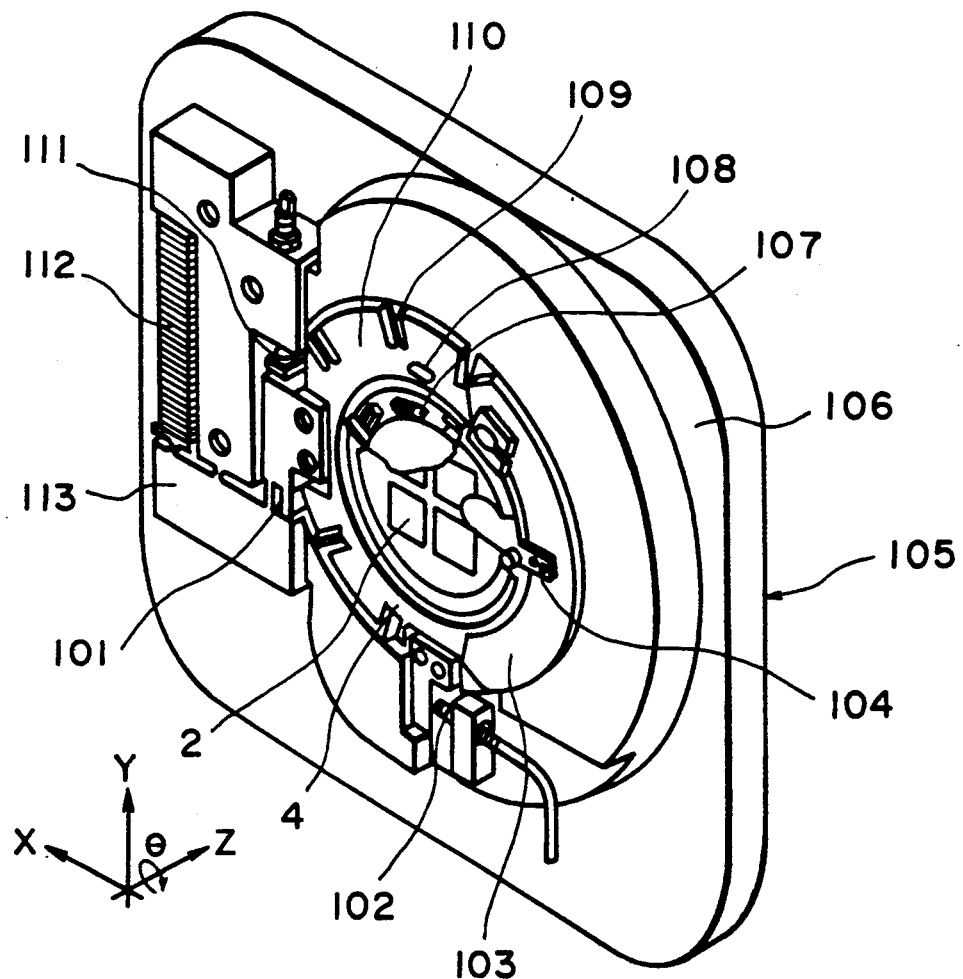
FIG. 1 is a perspective view of a mask chuck and a mask stage, according to an embodiment of the present invention.

FIG. 1 illustrates the structure of a mask $\theta$ stage portion of an exposure apparatus according to an embodiment of the present invention. In FIG. 1, denoted at 106 is a mask $\theta$ stage base which provides a base for a mask θ stage 4, and denoted at 109 are a plurality of radial leaf springs for supporting a mask 2 flexibly only in a rotational direction (θ direction) in one plane but rigidly in the other directions, relative to the mask θ stage base 106. Denoted at 107 is a mask chuck for detachably mounting the mask 2; at 103 and 104 are a positioning V-shaped block and a positioning pin, for mechanically positioning the mask 2; and at 102 is a displacement sensor for measuring the angle of relative rotation of the mask 2 to the mask θ stage base 106, approximately in terms of rectilinear displacement of a circumferential direction (θ direction). Denoted at 112 is a piezoelectric device which provides a displacement drive source for the mask θ stage 4; at 113 is a magnifying lever mechanism for magnifying displacement of the piezoelectric device 112; at 101 is a resilient coupling for transmitting the displacement, magnified by the magnifying mechanism 113, substantially only in the circumferential (θ) direction; and at 111 is a damper for attenuating vibration of the mask θ stage 4.

Denoted at 108 is a laser diode (LD) fixedly secured to the mask θ stage 4, an optical axis of which is projected toward the wafer stage side perpendicularly with respect to the mask 2 surface (X-Y plane).

Figure 2:
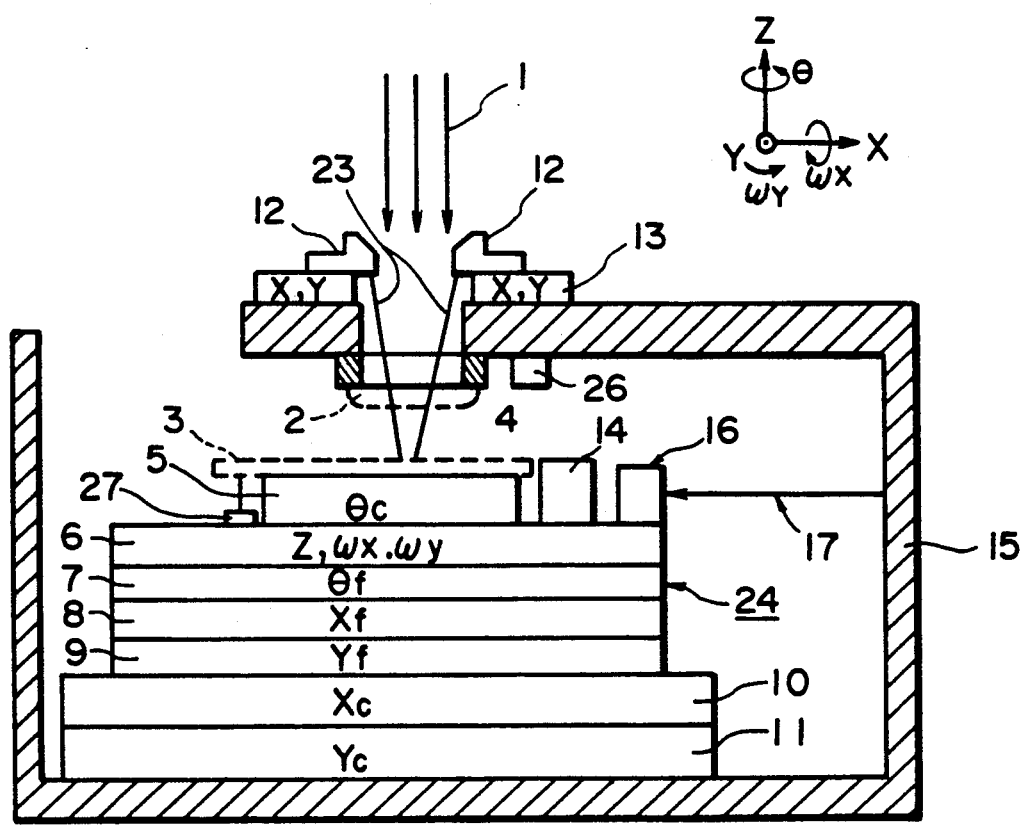
FIG. 2 is a schematic view of an exposure apparatus into which the arrangement of FIG. 1 is incorporated.

FIG. 2 illustrates the general structure of the exposure apparatus of this embodiment.

In FIG. 2, a wafer 3 is held by a wafer chuck (not shown) of a wafer stage 24. Rough-motion θ stage 5 is rotatable in the θ direction about the Z axis and is supported by a Z tilt stage 6. The stage 6 is movable in the Z direction and is supported by a fine-motion θ stage 7. The stage 7 is rotatable in the θ direction and is supported by a fine-motion X stage 8. The stage 8 is movable in the X axis direction and is supported by a fine-motion Y stage 9. The stage 9 is movable in the Y axis direction and is supported by a rough-motion X stage 10. The stage 10 is movable in the X direction and is supported by a rough-motion Y stage 11. The stage 11 is movable in the Y direction and is supported by a frame 15.

The position (X, Y) and the attitude (θ, ωx, ωy) of the stage device 24 can be measured by projecting a laser beam from a stationary position on the apparatus (frame 15) to a mirror 16 securedly fixed to the Z tilt stage 6 and by detecting reflected light through a laser interferometer.

Mask 2 is held by a mask chuck (not shown) of the mask θ stage 4. The mask θ stage 4 is rotatable in the θ direction within a plane (X-Y plane), a normal to which is codirectional with the exposure light 1 to be supplied to print a pattern of the mask 2 to the wafer 3. The stage 4 is supported by the frame 15.

A plurality of detection optical systems 12 (hereinafter each will be referred to as a "pickup") are provided to measure the gap (spacing) between a mask 2 and a wafer 3 with respect to the Z axis direction as well as an alignment error between the mask 2 and the wafer 3 in the X-Y plane. In this particular example, four pickups are provided. Each pickup 12 is movable in the X and Y directions and is supported by a corresponding pickup stage 13.

Reference numeral 23 denotes light beams projected from the pickups 12, respectively. Since each pickup 12 projects a light beam obliquely to the mask 2 and the wafer 3, from outside of the light path for the exposure light 1, upon the exposure operation any pickup 12 does not interfere with the exposure light 1. Therefore, it is not necessary to retract the pickups 12 at the time of an exposure operation.

The exposure light is projected so as to superimposingly print the pattern of the mask 2 onto a pattern or patterns on the wafer 3 having already been transferred thereonto. Gap sensor 27 is provided on the Z tilt stage 6 for relative measurement of the bottom surface of the wafer chuck (not shown).

Light receiving element 14 is provided on the Z tilt stage 6, and a light projecting element 26 is fixedly secured to the frame 15, at a position opposed to the wafer stage 24. The light receiving element 14 can receive and detect each of the light beams 23 projected from the pickups 12 for alignment detection as well as a light beam projected from the light projecting element 26. As regards a light beam received by the light receiving element 14, the position of the beam center is calculated such that, from this and from the positional data of the wafer stage 24 with respect to the X and Y directions obtainable from the laser interferometer beam 17, the position of the received beam center can be measured precisely.

Figure 8:
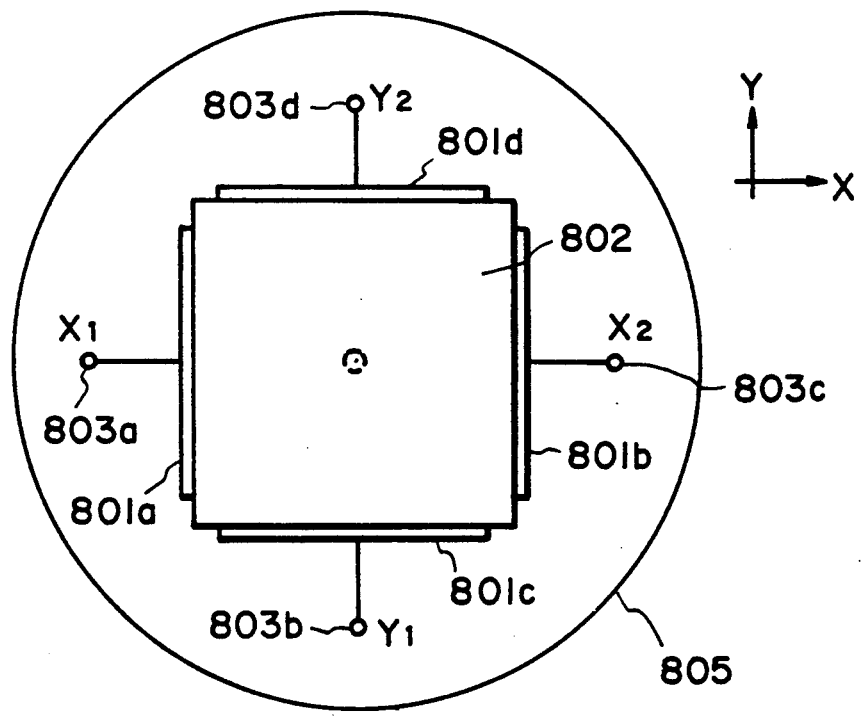
FIG. 8 is a schematic view, illustrating details of a light receiving element used in FIG. 2.

FIG. 8 illustrates details of the structure of the light receiving element 14. As illustrated, the light receiving element 14 comprises a planar silicon element 802 having electrodes 801a–801d mounted thereto. The whole structure including ends of leads 803a–803d of the electrodes 801a–801d, is accommodated in a single package 805. The coordinate (Px, Py) of a spot of a light beam projected upon the silicon element 802 with reference to a middle point of the element, can be determined from the following relations:

$$(X2-X1)/(X1+X2)=Px/L \tag{1}$$

$$(Y2-Y1)/(Y1+Y2)=Py/L \tag{2}$$

wherein X1, Y1, X2 and Y2 are photoelectric currents flowing between a center electrode 804 and the respective electrodes 801a–801d of the light receiving element, and L is the distance from the center electrode 804 to each of the electrodes 801a–801d.

The position of the beam spot with respect to the stage coordinate system can be determined on the basis of a value (Px, Py) as read from the light receiving element 14, a measured value on the laser interferometer axis of the stage X-Y coordinate system and the disposition (fixed value) of the light receiving element 14 on the wafer stage 24.

Figure 3:
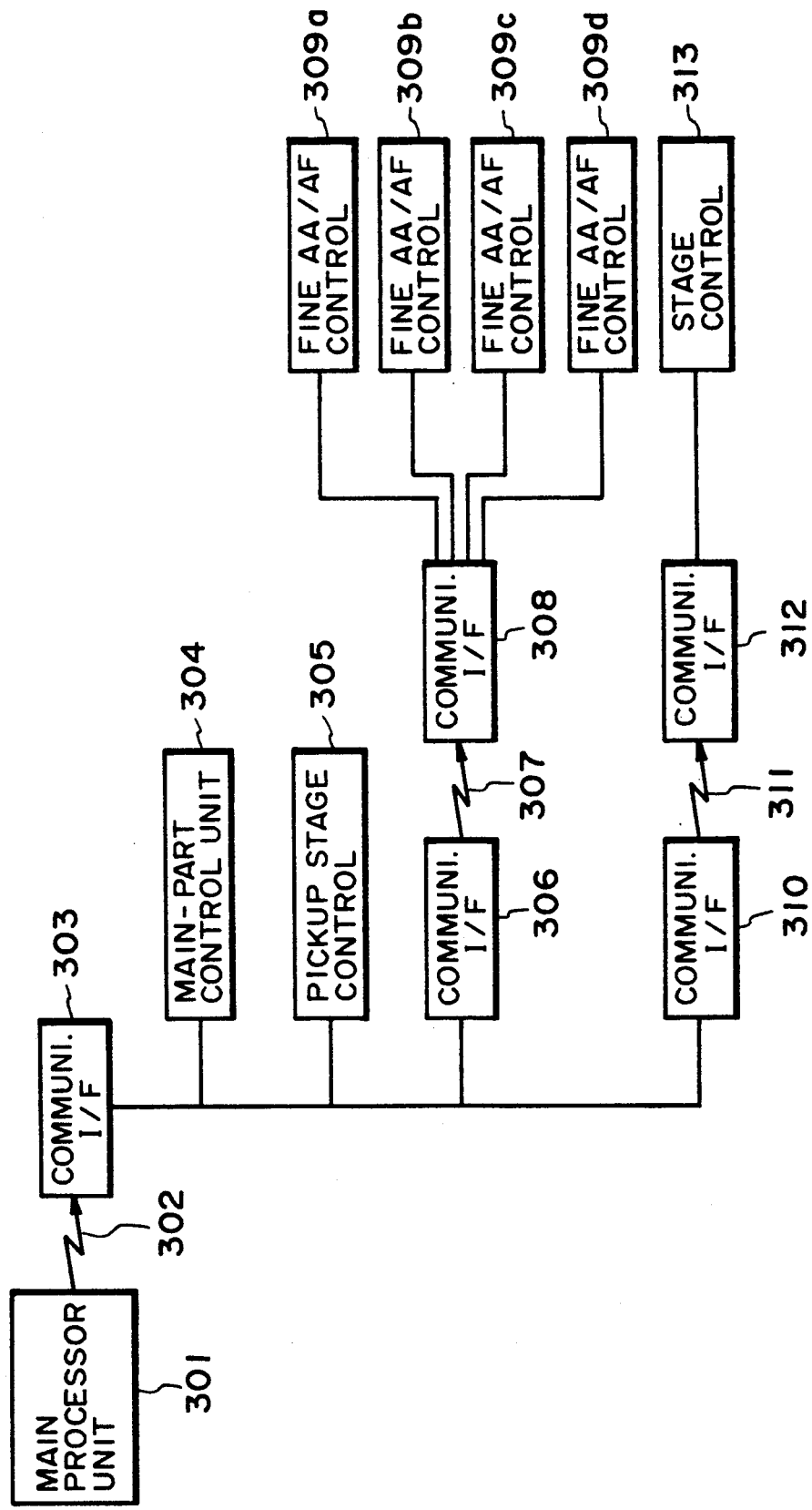
FIG. 3 is a block diagram of electrical hardware for controlling the exposure apparatus of FIG. 2.

FIG. 3 is a block diagram of a control system of the exposure apparatus. As seen from the drawing, in the exposure apparatus of this embodiment, all the functions are controlled under the influence of a main processor 301, provided uppermost. The main processor 301 communicates with various hardware units by way of a communication path 302 and a communication interface (I/F) 303. In FIG. 3, only those hardware units as having an alignment function, a stage control function, a pickup stage control function and the like are illustrated. Here, for convenience, these hardware units will be called "main part control blocks".

With regard to the alignment system, as such main part control blocks, there are provided a pickup stage controller 305 for controlling the positioning of the four pickups 12 with respect to two axis direction (X axis and Y axis), four fine autoalignment (AA) and autofocusing (AF) controllers 309a–309d for correction of any positional error between a wafer 3 and a mask 2 in the X-Y plane and for parallelism setting (ωx, ωy) of them, and a stage controller 313 for controlling the positioning of each of the rough-motion X stage 10, the rough-motion Y stage 11 and the fine-motion stages 6-9.

Main-part control unit 304 has stored therein appropriate programs for execution of predetermined sequences and serves to control the operation of each controller in accordance with a corresponding sequence. Further, the control unit 304 communicates with the prior main processor unit 301 by way of the communication path 302 and the communication I/F 303 for transfer of data therebetween.

Of the above-described controllers, the fine AA and AF controllers 309a-309d and the stage controller 313 communicate with the control unit 304 by way of communication interfaces (306 and 308; 310 and 312) and through communication paths (307; 311) for data transfer therebetween.

Each of these controllers, being communicated with the main-part control unit 304 by associated communication paths, is equipped with a central processing unit (CPU) disposed therein, such that all the hardware signal processing can be completed in each controller. This structure allows independent operation of each controller and hierarchical arrangement of the control system.

Figure 4:
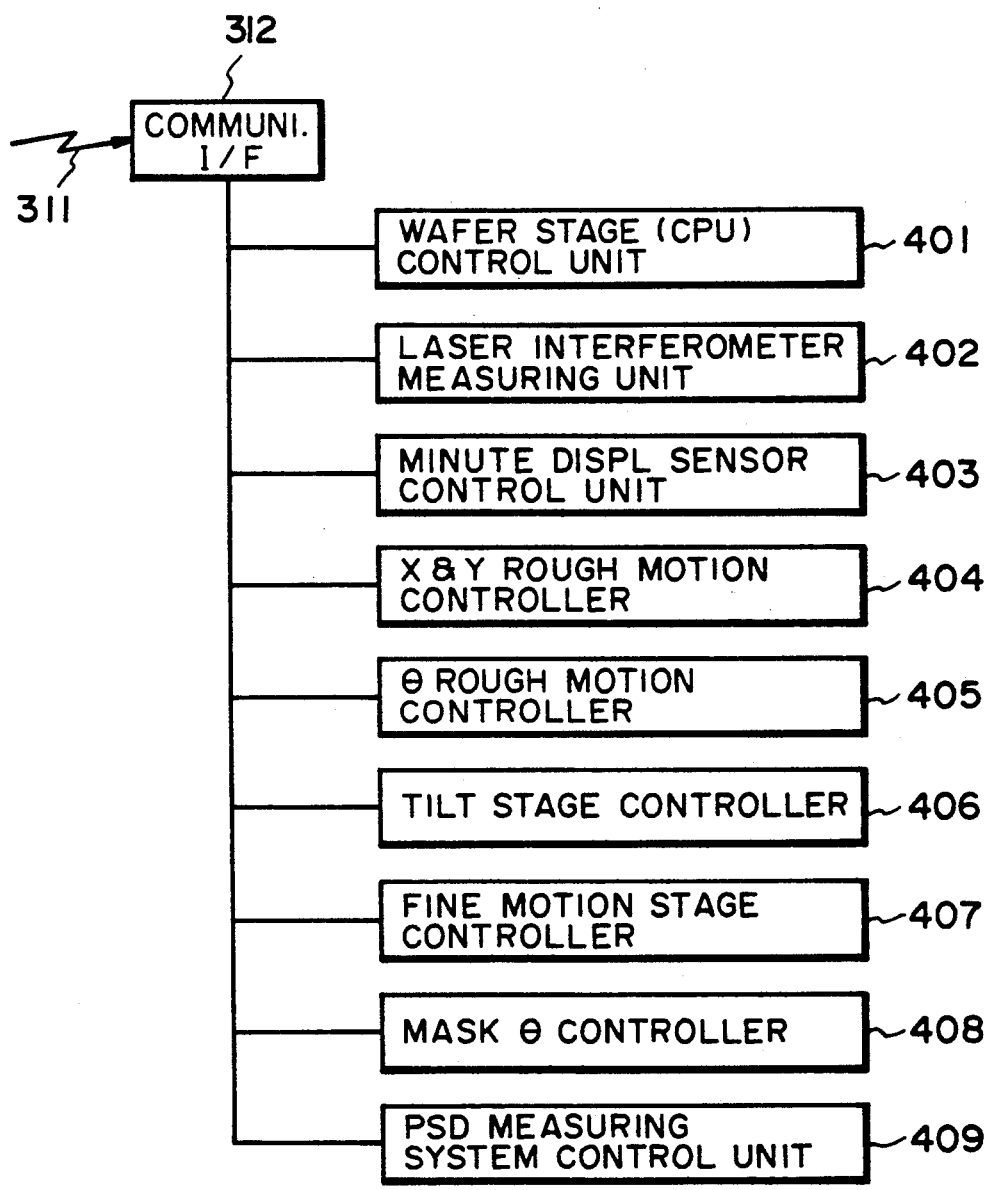
FIG. 4 is a block diagram of electrical hardware of a stage controlling means in FIG. 3.

FIG. 4 is a block diagram, illustrating details of the stage controller 313 in FIG. 3. Between this unit and the control unit 304, information can be transmitted by way of communication interfaces 310 and 312 and through a communication path 311. Wafer stage control unit 401 includes a CPU (not shown) and serves to calculate the amount of drive of each actuator, provided in the wafer stage 24, corresponding to a target or desired position of the stage as supplied from the control unit 304. Additionally, the wafer stage control unit 401 has a processing function for converting the data supplied from a PSD measuring system control unit 409, which receives a signal produced by a light receiving sensor (PSD) 14 on the wafer stage 24, into corresponding positional data. Laser interferometer measuring unit 402 serves to execute position measurement with respect to five axes, excluding an axis (Z axis) in the direction of a normal to the wafer surface (X-Y plane). Minute-displacement sensor control unit 403 serves to execute driving and signal processing for a minute-displacement sensor 27, to thereby measure the amount of displacement of the wafer stage 24 in the Z axis direction. X-Y rough motion controller 404 serves to control electric cylinders of the rough-motion X and Y stages 10 and 11 shown in FIG. 2. Reference numeral 405 denotes θ rough-motion controller. The θ rough-motion axis rides on the X and Y drive axes of the stages 8-11, the Z, $\omega_X$ and $\omega_Y$ drive axes of the stage 6 and the θ fine motion axis of the stage 7, as seen in FIG. 2, and any change in the position of the wafer stage 24 resulting from displacement of the θ rough-motion axis of the stage 5 is not reflected to the motion of the mirror 16 for reflecting the light 17 from the interferometer. Accordingly, in this embodiment, an inchworm actuator is used as an actuator for the θ rough-motion axis and, by doing so, any change in the position of the stage 5 after the θ axis rough alignment can be prohibited. Tilt stage controller 406 serves to execute the positioning of in the Z, $\omega_X$ and $\omega_Y$ directions by using three piezoelectric actuators. In response to an instruction from the wafer stage control unit 401, it controls the position of the tilt stage 6 mounted on the X and Y drive axes and the θ fine-motion axis. Fine-motion stage controller 407 serves to control minute-displacement actuators of the fine-motion X and Y drive axes of the stages 8 and 9. Mask θ controller 408 serves to control the mask θ fine-motion stage 4 mounted on the mask stage.

Figure 5:
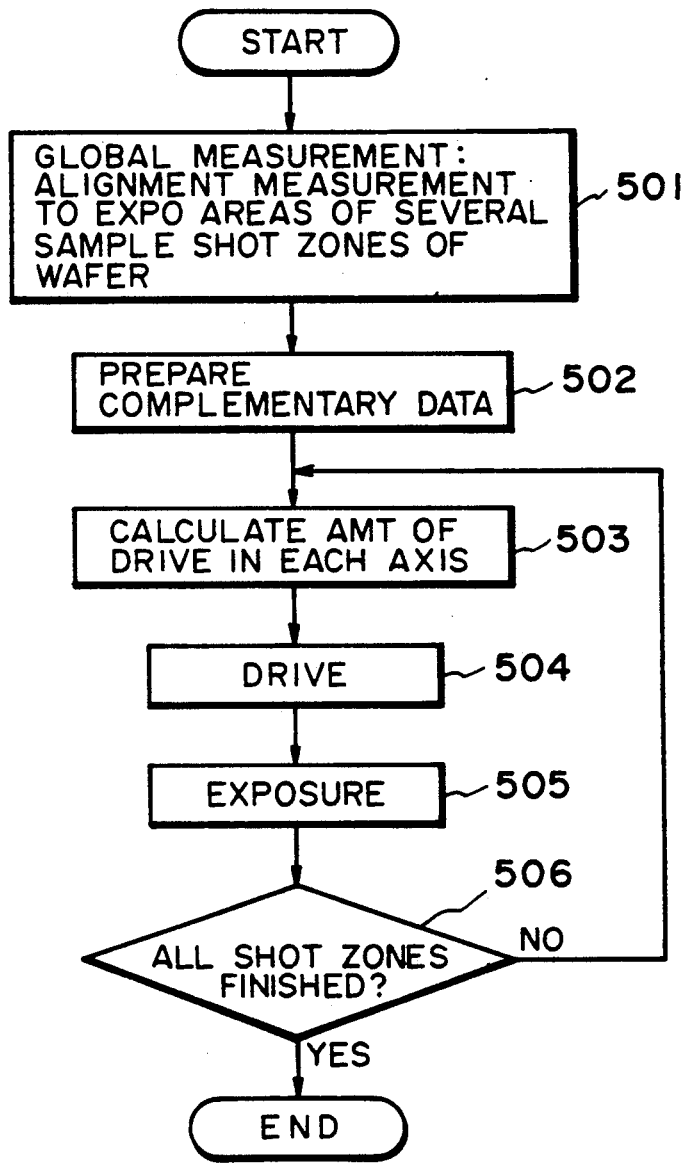
FIG. 5 is a flow chart showing the sequence of wafer exposure according to a global alignment method, to which the present invention is applied.

FIG. 5 illustrates an exposure sequence according to a global alignment method. The operation of the exposure apparatus will now be explained by reference to FIG. 5. First, at step 501, alignment measurement is executed by using the pickups 12 with respect to those exposure areas of a wafer 3, placed on the wafer chuck, corresponding to several representative shot zones of the wafer. Those shot areas to which the alignment measurement is to be executed are such as, for example, those denoted at 601a-601e in FIG. 6. To the remaining shot areas 602 to which the alignment measurement is not executed, complementing and prediction are executed (step 502) from the alignment measurement data as obtained from the adjacent shot areas 601a-601e to which the alignment measurement has been made. At step 503, the amount of drive in each axis of the wafer stage 24 and the mask stage 4, necessary for aligning the shot areas of the wafer 3 to a pattern formed on the mask 2, is calculated. Here, if the coordinate of a movement target position P is given by an absolute position coordinate such as P(X, Y, Z, θ, $\omega_X$, $\omega_Y$), then the drive target positions (X, Y, θ, Z1, Z2, Z3) of the respective axes can be expressed as follows: (i) As regards the three piezoelectric actuators for driving the tilt stage 6 toward Z1, Z2 and Z3:

$$\begin{bmatrix} Z1 \\ Z2 \\ Z3 \end{bmatrix} = \begin{bmatrix} A_T \end{bmatrix} \begin{bmatrix} Z \\ \omega_x \\ \omega_y \end{bmatrix} \quad (3)$$

(ii) As regards the piezoelectric actuator of the mask stage 4:

$$\theta_M = L_M \theta \quad (4)$$

(iii) Target values X and Y of the X and Y stages (8, 10; and 9, 11) are:

$$X = x - f_T(Z1, Z2, Z3) - f_M(\theta_M) \quad (5)$$

$$Y = y - g_T(Z1, Z2, Z3) - g_M(\theta_M) \quad (6)$$

wherein $A_T$ is a transformation matrix as determined by the positional relationship of the three piezoelectric actuators of the tilt stage 6, and $L_M$ is the distance from the mask center of the piezoelectric actuator 112, on the minutely displaceable mask stage 4, to the point of application. The functions $f_T$ and $g_T$ correspond respectively to the produced displacements by Abbe's length between the $\omega_X$ and $\omega_Y$ rotational axes of the tilt stage and the laser interferometer axis 17, caused by tilting the tilt stage 6 in the $\omega_X$ and $\omega_Y$ directions, with respect to the X and Y axes. The characters $f_M$ and $g_M$ represent the produced displacements in the X and Y directions of the rotational center of the mask stage resulting from the drive of the mask θ stage 4, as added freshly as a corrective term in accordance with the present invention. These displacements are not those as produced intentionally, but are those resulting from variation in rigidity of the leaf springs 109, supporting the mask stage 4, or produced by the expansion/contraction of each leaf spring, disposed in the direction of the force applied to the point of application, which might result from the force produced by the piezoelectric actuator 112 being applied only to a single point on the circumference of the mask stage 4. The functions $f_M$ and $g_M$ are prepared when the exposure apparatus of the present embodiment is started, and the manner of preparation will be described later.

Next, at step 504, drive instructions are applied to the axes of various stages for alignment of the mask 2 and the wafer 3. At step 505, exposure of the wafer having been aligned by the blind feeding, is effected. Then, at step 506, discrimination is made as to whether the exposures of all the shot areas are completed. If completed, the exposure operation of that wafer 3 is finished. If not completed, the sequence goes back to step 503 whereby the next shot area is processed.

Figure 6:
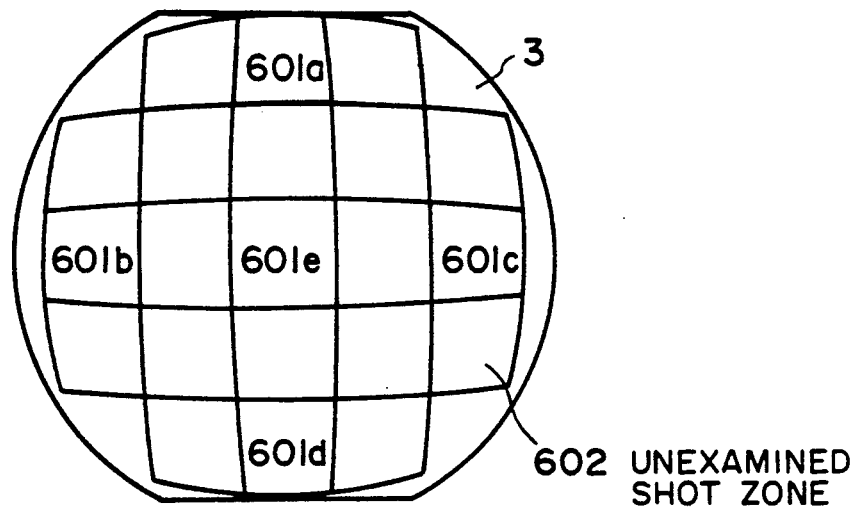
FIG. 6 illustrates a disposition of global alignment measuring shot zones on a wafer.

FIG. 6 illustrates those shot areas 601a–601e on a wafer 3, to which the alignment measurement according to the global alignment method is effected. Reference numeral 602 denotes such a shot area (hereinafter "unexamined shot area") to which the alignment measurement is not effected and which is then exposed on the basis of the blind feeding to a position as determined by prediction based on adjacent examined shot areas.

Figure 7:
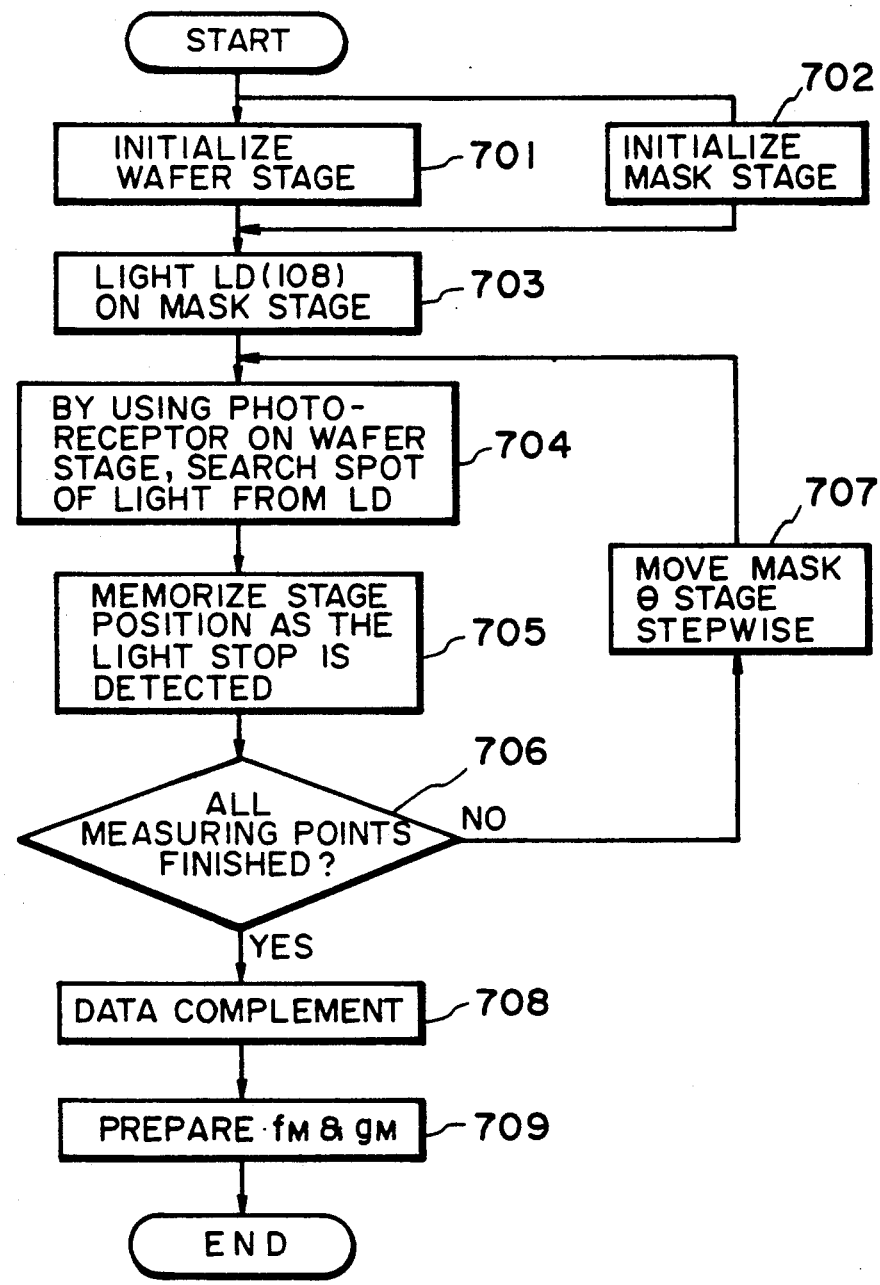
FIG. 7 is a flow chart of the sequence for determining displacements $f_M$ and $g_M$ of the rotational center of a mask stage, in X and Y directions, caused with the motion of a mask $\theta$ stage.

FIG. 7 is a flow chart showing a sequence of preparing the functions $f_M$ and $g_M$, having been described with reference to FIG. 5. In FIG. 7, when the exposure apparatus is started, the initialization of the wafer stage 24 and the mask stage 4 is executed in parallel (steps 701 and 702).

Subsequently, at step 703, the laser diode (LD) 108 on the mask stage 4 is actuated, so that a light beam is projected to the mask 2 in a direction (Z axis direction) perpendicular thereto. At step 704, the wafer stage 24 is moved to move the light receiving element 14 along the X-Y plane so as to search a spot of a laser beam projected from the LD 108, and the wafer stage 24 is controlled so that the laser spot impinges on the center electrode 804 of the light receiving element 14 (see FIG. 8). When the laser spot impinges on the center electrode 804, at this position the movement of the wafer stage 24 is stopped. Whether or not the light from the LD 108 is detected by the center electrode 804 of the light receiving element 14, can be discriminated by using equations (1) and (2). When Px and Py as obtainable from these equations are both equal to zero, it is discriminated that the light from the LD 108 is at the position on the center electrode 802. At step 705, the position of the wafer stage 24 in the X and Y directions, at the moment whereat the spot of light from the LD 108 impinges on the center electrode 802 of the light receiving element 14, are memorized into a memory of the wafer stage control unit 401, together with the amount of rotation (the rotational position in the $\theta$ direction) of the mask stage 4 from its initialized position. The position of the wafer stage 24 in the X and Y directions, at that time, can be measured by using the mirror 16 and the laser interferometer beam 17 and through the laser interferometer measuring unit 402 (FIG. 4).

At step 706, discrimination is made as to whether the measurement has been completed with respect to all the measuring points to be sampled with respect to the rotational position of the mask stage 4 in the $\theta$ direction. If not yet completed, at step 707 the mask $\theta$ stage 4 is moved stepwise in the $\theta$ direction by a predetermined amount and, thereafter, the sequence goes back to step 704 and the measurement to the next measuring point is executed and the above-described operation is repeated. If all the measurements are completed, the data stored in the wafer stage control unit 401 is transferred to the main-part control unit 301 and a table preparing process is effected. More specifically, from the changes in the position of the wafer stage 24 in the X and Y directions, each having been measured each time the mask stage 4 was moved stepwise in the $\theta$ direction by a predetermined amount, the displacement of the mask stage 4 in the X and Y directions to be produced with a rotational displacement of the mask stage 4 in the $\theta$ direction is calculated. Then, by using displacements obtained by calculation with respect to the plural measuring points, respectively, a table that concerns the displacement of the mask stage 4 in the X and Y directions to be produced with a rotational displacement of the mask stage 4 in the $\theta$ direction, over the whole range of rotation of the mask stage 4, is prepared. Then, at step 709, the functions $f_M$ and $g_M$ (or a conversion table) are prepared on the basis of the table prepared at step 708 and by calculation according to a least square method, for example, and the prepared function are transferred to the wafer stage control unit 401.

Figure 9:
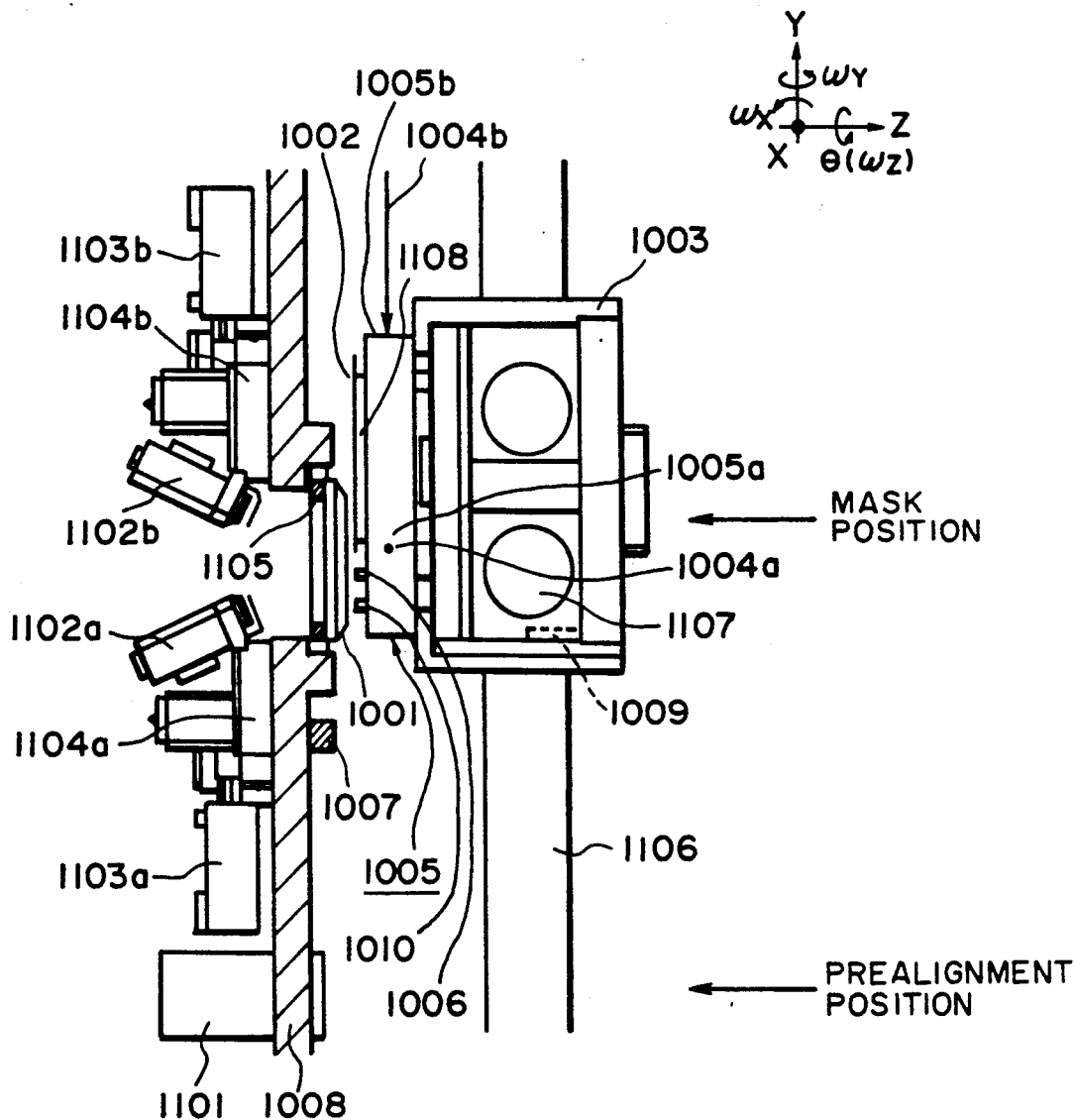
FIG. 9 is a fragmentary schematic view of an exposure apparatus according to another embodiment of the present invention.

FIG. 9 shows an exposure apparatus according to another embodiment of the present invention. Denoted in this Figure at 1001 and 1002 are a mask and a wafer which are disposed opposed to each other and parallel to the X-Y plane, with a clearance of 10–50 microns maintained therebetween. Denoted at 1003 is a wafer stage; at 1005 is a mirror fixedly secured to the wafer stage 1003 and having mirror surfaces 1005a and 1005b which are parallel to the Y-Z plane and the X-Z plane, respectively. Denoted at 1108 is a wafer chuck mounted on the mirror 1005, and denoted at 1006 is a light receiving element (PSD), similar to that shown in FIG. 8, which is mounted on the mirror 1005. The wafer stage 1003 has a function for controlling the position of the wafer chuck 1008 with respect to the directions of six axes (X, Y, Z, $\omega x$, $\omega y$ and $\omega z$). Reference numerals 1106 and 1107 denote guide members for a rough-motion Y axis electric cylinder and a rough-motion X axis electric cylinder (both not shown). As will be described later in conjunction with FIG. 10, a fine-motion stage device to be driven by a piezoelectric actuator is placed on the rough-motion X and Y axis stages to be guided by these guide members. Reference numerals 1004a and 1004b each denotes an optical axis for measurement of the position of the stage 1003 through a laser interferometer (not shown). The mirror 1005 serves to reflect light of the measurement optical axis of each laser interferometer. The mirror surface 1005a reflects the light in the measurement optical axis 1004a parallel to the X axis, and is used for the measurement of displacement in the X axis direction and the $\omega Y$ axis direction. On the other hand, the mirror surface 1005b reflects the light in the measurement optical axis 1004b parallel to the Y axis, and is used for the measurement of displacement in the Y axis direction, the $\omega x$ axis direction and the $\omega z$ axis direction. Denoted at 1007 is a light source (LD) which is fixedly secured to a frame 1008 and which is adapted to emit a light beam in a direction (Z direction) perpendicular to the mask surface (X-Y plane). With regard to the wafer stage 1003, prior to a start of position measurement through the interferometers, the PSD 1006 is moved and positioned so as to be opposed to the LD 1007, for corrective setting of an origin, as will be described later in detail. Reference numeral 1105 denotes a mask chuck which functions also as a rotational stage, rotatable in the $\omega x$ direction. Denoted at 1101 is a prealignment measuring unit. Upon loading of a wafer, the wafer stage 1003 moves to place the wafer chuck 1108 at a position opposed to the prealignment measuring unit 1101. Denoted at 1102a and 1102b are fine alignment measuring optical systems (pickups) which are mounted on pickup stages 1104a and 1104b, respectively, and are adapted to be moved along the X-Y plane by means of actuators 1103a and 1103b, respectively. Also, each of the optical axes as projected by these measuring optical systems 1102a and 1102b, can be received by the PSD 1006 and thus the position thereof can be detected by the PSD. On the basis of the detected positions, it is possible to obtain corrective values for the controlled positions of the pickup stages 1104a and 1104b, as considered in the X-Y coordinate system of the stage 1003. Reference numeral 1008 depicts the housing of the exposure apparatus, and the Y axis rough-motion stage guide member 1106, the LD 1007, the mask chuck 1105, the pickup stages 1104a and 1104b and the prealignment unit 1101 are all mounted on this housing. Denoted at 1009 is a linear scale. When the wafer stage 1003 is at such a position at which the measurement through the laser interferometer in the X axis direction is not attainable, for example, when the stage 1003 is at the prealignment position (as depicted by an arrow), the linear scale 1009 serves to execute rough position measurement until the wafer stage 1003 returns to the position (mask position) opposed to the mask 1001 so that the position measurement by the laser interferometer is recovered. When the stage 1003 is at the prealignment position, the mirror surface 1005a is spaced apart from the position of the measurement optical axis 1004a. Therefore, with respect to the X axis direction, the laser beam of the interferometer is not reflected and, thus, the measurement of the position of the wafer stage 1003 in the X direction through the interferometer measuring unit 1402 is not attainable.

Denoted at 1010 is a reference mark which is fixedly provided on the mirror 1005 of the wafer stage 1003 and is used for the mask alignment.

With the structure described above, it is possible to control the coordinate of the wafer stage 1003 and the coordinate of the pickup stages 1104a and 1104b, under a unit coordinate system having the LD 1007 on the housing 1008 as an immovable point, while using the PSD 1006 as a medium.

Figure 10:
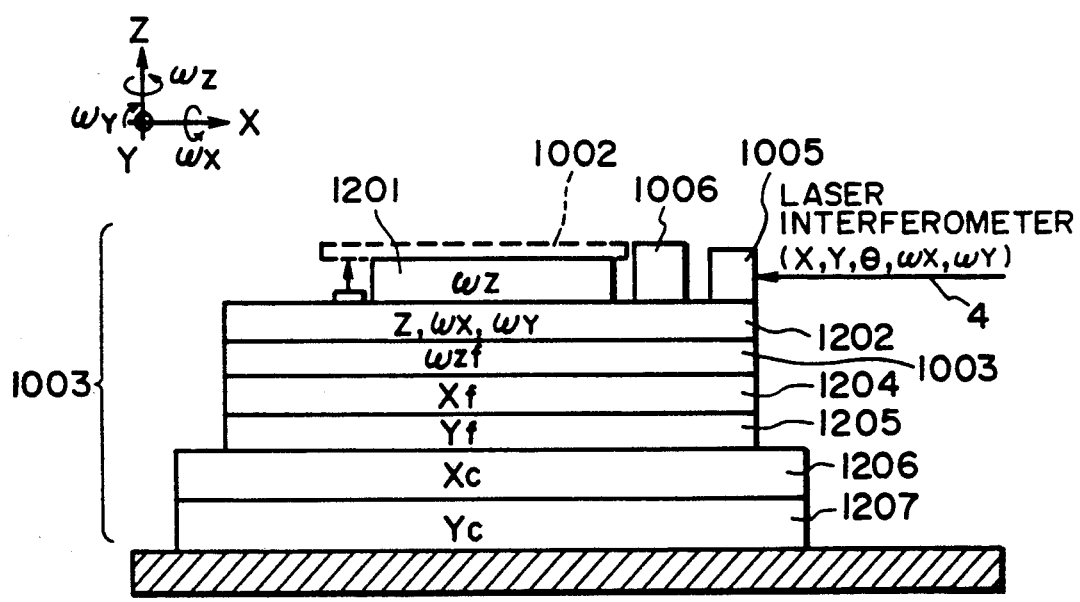
FIG. 10 is a schematic view of a wafer stage used in the apparatus of FIG. 9.

FIG. 10 is a schematic view of the wafer stage 1003. In the drawing, denoted at 1201 is an ωz rough-motion stage which is driven by an inchworm piezoelectric actuator (not shown) and which is used for the rotation of the wafer 1002 in the ωz direction, at the time of a prealignment operation. During a period other than this, the piezoelectric devices (not shown) provided at the opposite ends of the inchworm are clamped by guide members, so that it does not move. Denoted at 1202 is a tilt stage which is supported by three piezoelectric devices (not shown) and which is movable through a minute displacement in the Z, ωx and ωy directions. Reference numerals 1203-1205 denote minute-displacement stages, respectively, driven by piezoelectric actuators (not shown) in the ωz, X and Y directions, respectively. Reference numerals 1206 and 1207 denote an X direction rough-motion stage and a Y direction rough-motion stage, respectively, which are driven by the electric cylinders described hereinbefore.

Next, the electrical hardware structure for controlling the operation of this apparatus will be explained.

Figure 11:
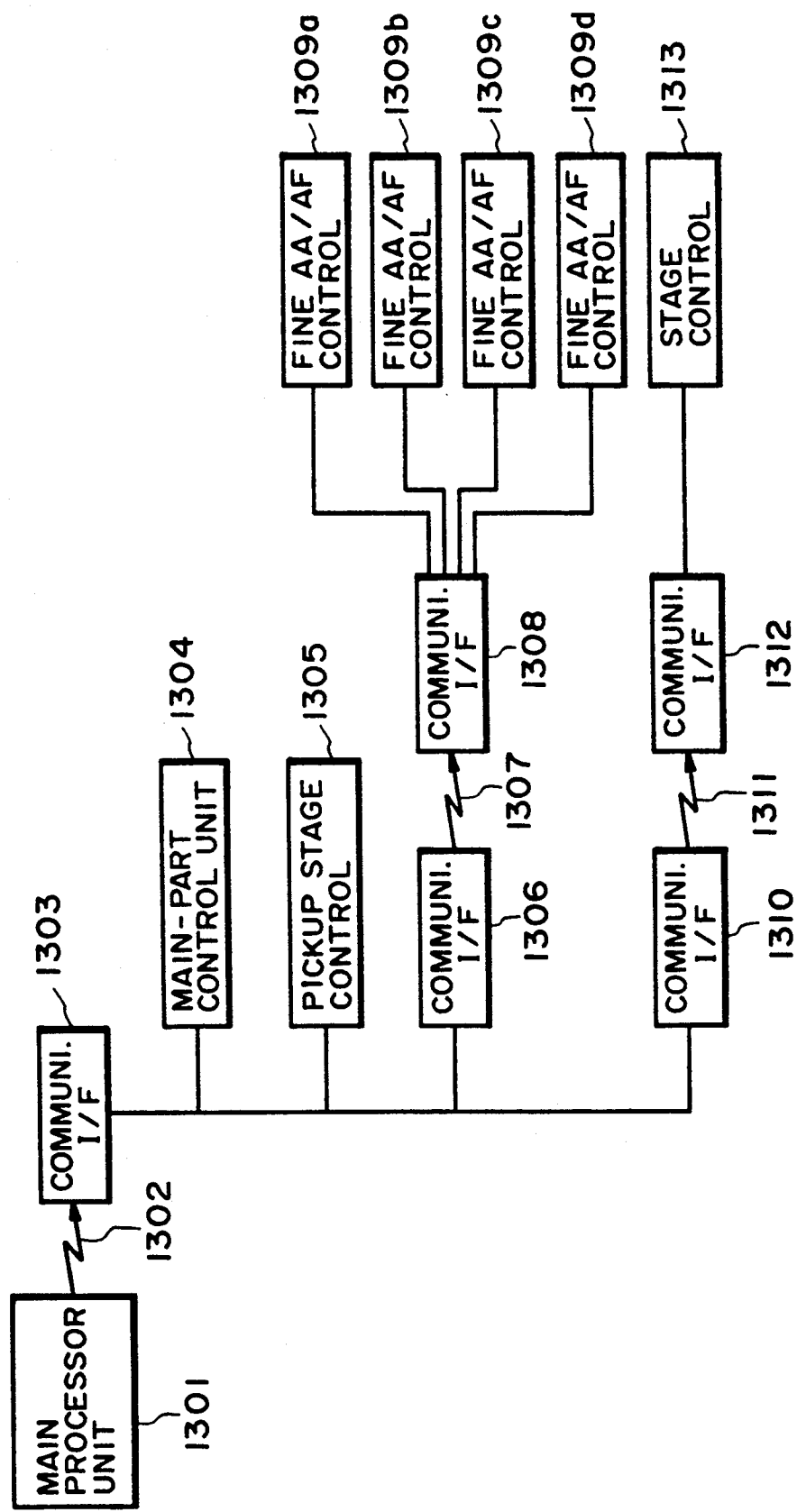
FIG. 11 is a block diagram of electrical hardware for controlling the apparatus of FIG. 9.

In the exposure apparatus of this embodiment, as illustrated in FIG. 11, all the functions are controlled under the influence of a main processor unit 1301, provided uppermost. The main processor unit 1301 communicates with various hardware units by way of a communication path 1302 and a communication interface (I/F) 1303. In FIG. 11, only those hardware units as having an alignment function, a stage controlling function and a pickup stage controlling function, are illustrated. Here, for convenience, those hardware units will be referred to as "main-part control blocks".

As for the main-part control blocks, with regard to the alignment system, there are provided a pickup stage controller 1305 for controlling the positioning of the four pickups 1102a and 1102b, and the like, with respect to two axis directions (X axis and Y axis), fine autoalignment (AA) and autofocusing (AF) controllers 1309a-1309d, for correction of a positional error between a wafer and a mask in the X-Y plane as well as for the parallelism setting of them, and a stage controller 1313 for controlling the positioning of each of the X and Y rough-motion stages 1206 and 1207 and the fine-motion stages 1203-1205. Main-part control unit 1304 has stored therein appropriate programs for execution of corresponding sequences, and it controls the operation of each controller in accordance with a corresponding sequence. As described, the control unit 1304 communicates with the prior main processor unit 1301 by way of the communication path 1302 and the communication interface 1303, for transfer of data therebetween.

Of the controllers described above, the fine AA and AF controllers 1309a-1309d and the stage controller 131 communicate with the control unit 1304 by way of communication interfaces (1306 and 1308; 1310 and 1312) through communication paths (1307; 1311), for data transfer therebetween.

Each of the controllers being communicated with the control unit 1304 by way of these communication paths is equipped with a central processing unit (CPU) disposed therein, and all the hardware signal processing can be completed in each controller. With this structure, independent operation of each controller as well as the hierarchical arrangement of the control system are attainable.

Figure 12:
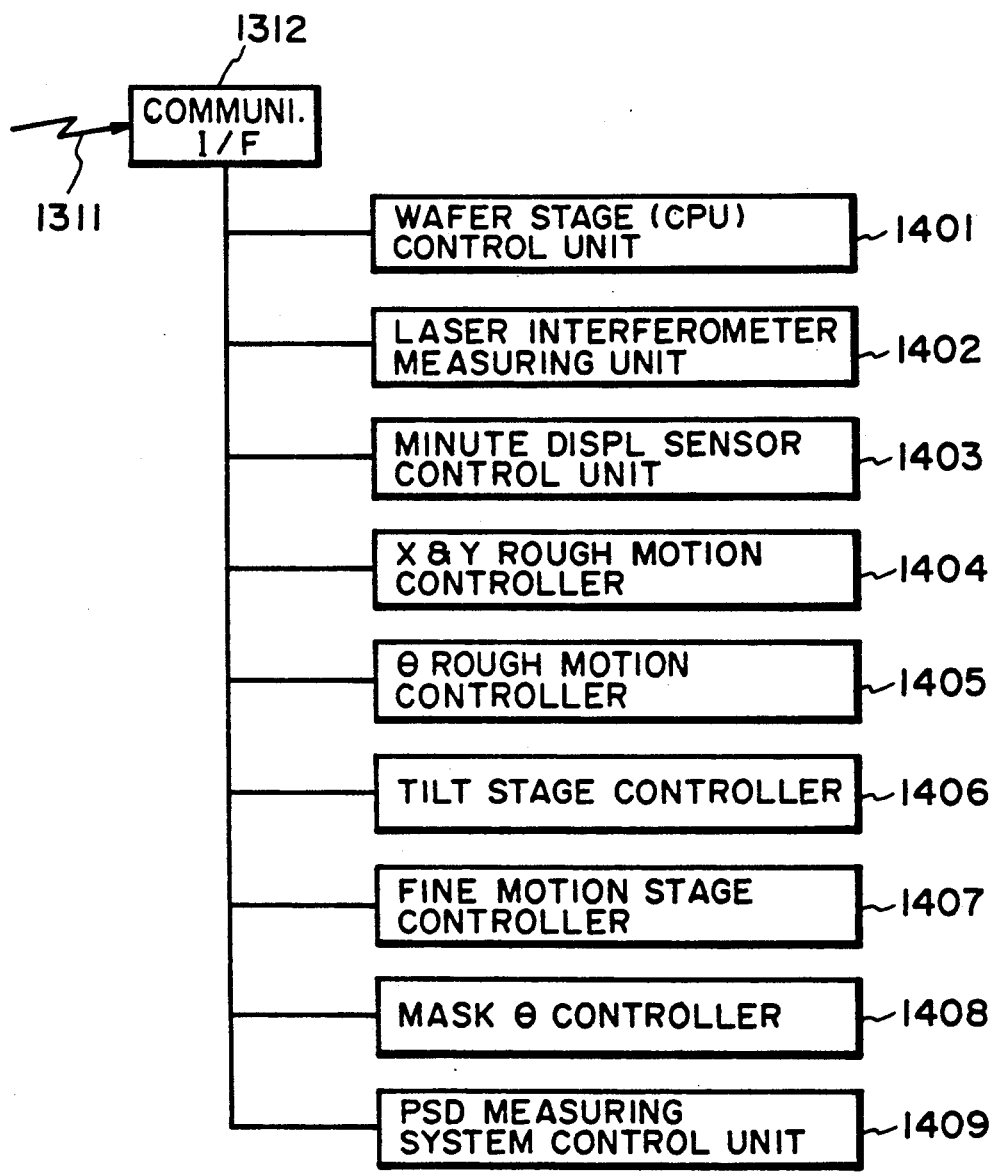
FIG. 12 is a block diagram, illustrating details of a wafer stage controlling means in FIG. 11.

FIG. 12 is a block diagram, illustrating details of the stage controller 1313 shown in FIG. 11. As described, between this unit and the control unit 1304, transfer of information is attainable by way of the communication interfaces 1310 and 1312 and the communication path 1311. Wafer stage control unit 1401 is equipped with a CPU (not shown) and serves to calculate the amount of drive of each actuator, accommodated in the wafer stage 1003, in accordance with a target or desired position of the stage as supplied from the control unit 1304. Additionally, it has a processing function for converting the data supplied from a PSD measuring system control unit 1409 which receives a signal produced by a light receiving sensor (PSD) 1006 on the wafer stage 1003, into corresponding positional data. In FIG. 12, denoted at 1402 is a laser interferometer measuring unit which serves to execute the position measurement with respect to five axes, excluding an axis, i.e., Z axis, in the direction of a normal to the wafer surface. Denoted at 1403 is a minute-displacement sensor control unit which serves to measure the Z axis displacement of the wafer stage by the driving and signal processing for a minute-displacement sensor of the tilt stage, placed on the rough-motion stage.

X-Y rough-motion controller 1404 serves to control electric cylinders for the X rough-motion (Xc) and the Y rough-motion (Yc). Denoted at 1405 is a θ rough-motion controller. The θ rough-motion axis (ωz rough-motion stage 1201) rides on the X and Y drive axes (stages 1204–1207), the Z, ωx and ωy drive axes (stage 1202) and the θ fine-motion axis (stage 1203), and any change in the position of the wafer stage 1003 resulting from displacement of the θ rough-motion axis is not reflected to the motion of the mirror 1005 for reflecting the light 1004 from the interferometer. Accordingly, in the present invention, an inchworm actuator is used as an actuator for the θ rough-motion axis, whereby any change in the position of the ωz rough-motion stage 1201 after the θ axis rough alignment can be prohibited. Tilt stage controller 1406 serves to control, in response to an instruction from the wafer stage control unit 1401, the position of the tilt stage 1202 mounted on the X and Y drive axes and the θ fine-motion axis. Fine-motion stage controller 1407 serves to control minute-displacement actuators for the X and Y drive axes. Mask θ controller 1408 serves to control the mask θ fine-motion motion stage (rotatable mask stage, rotatable in the ωz direction) carried on the mask stage.

Figure 13:
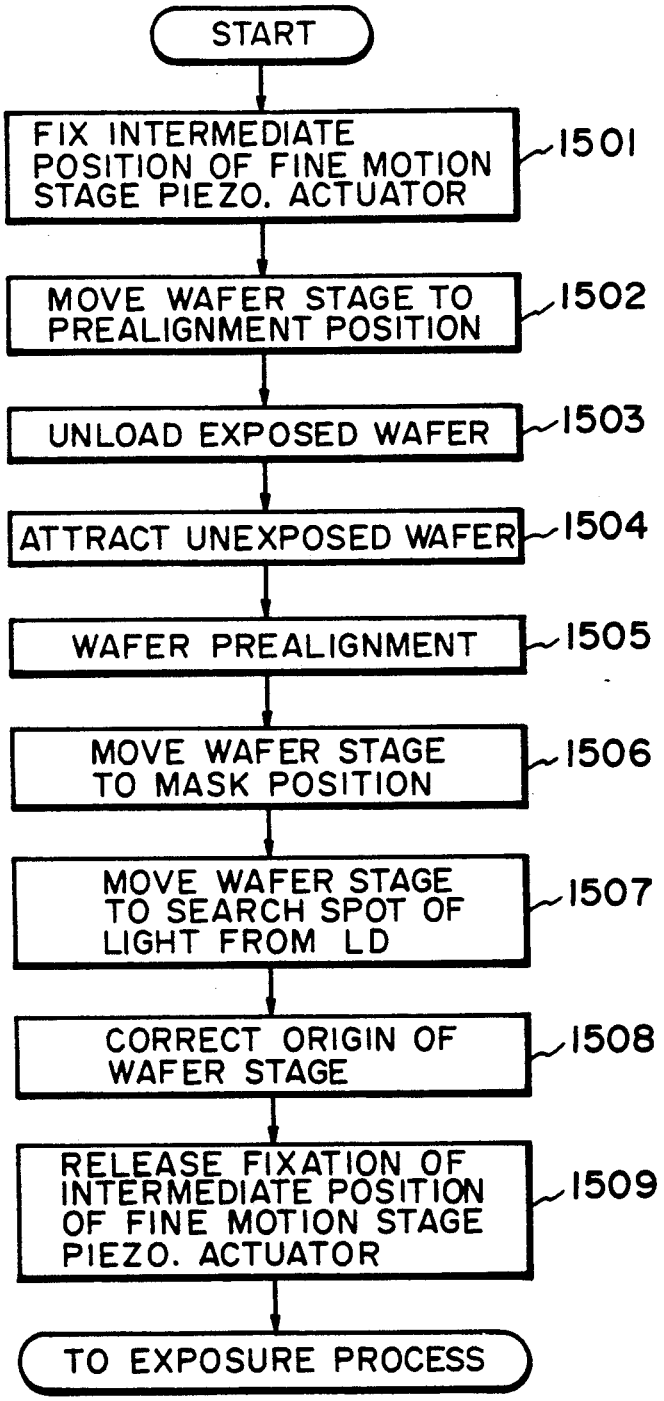
FIG. 13 is a flow chart, illustrating a wafer replacement sequence in the apparatus of FIG. 9.

FIG. 13 illustrates an operational sequence of wafer replacement, in the present embodiment. In this sequence, upon a start of a wafer replacing operation, first at step 1501 electric voltages applied to the electrodes of the piezoelectric actuators, providing movements of the fine-motion stages 1204 and 1205 carried on the rough-motion X and Y axes, are fixed at a certain constant level to thereby hold the displacement of the fine-motion stages 1204 and 1205. Subsequently, at step 1502, the wafer stage is moved downwardly to the prealignment position (see FIG. 9) at which the prealignment unit 1101 is provided. At this position, for the reason as described hereinbefore, only the position with respect to the Y, ωx and ωz axis directions can be measured by the laser interferometer unit 1402, and measurement of the position in the X axis direction is executed by using the linear scale 1009 which is a rough position measuring means. Since, with regard to the Z and ωy axes the corresponding piezoelectric actuators are clamped, the same position is held. Subsequently, at step 1503, an exposed wafer 1002 is collected from the wafer chuck 1108 and, after this, at step 1504 an unexposed wafer 1002 is placed on the wafer chuck 1108, and the wafer is held by the chuck by attraction. At step 1505, the prealignment operation for the thus attracted wafer 1002 is executed by using the prealignment measuring optical system 1101 and by driving the rough-motion X, Y and θ axes. Then, at step 1506, the wafer stage 1003 is moved upwardly along the Y axis direction to a position opposed to the mask 1001. At step 1507, the wafer stage 1003 is so positioned that a spot of light projected from the LD 1007 is received by the PSD 1006 in a predetermined state. Detection of the light spot is effected in the same manner as has been described with reference to FIG. 8. Since, at this time, the measurement of the position, at the X axis side, of the laser interferometer unit 1402 to the wafer stage 1003 is not yet recovered, the rough-motion X axis feeding is effected by using the linear scale 1009. At step 1508, correction is made to the coordinates as having been held, when the spot of the light beam from the LD 1007 is incident on the center electrode 804 (FIG. 8), so as to assure that the position of the spot of the light beam from the LD 1007 just coincides with the origin of each of the X axis and the ωy axis, with respect to the X-Y coordinate system of the wafer stage 1003. After this, the measurement of the position in the X axis and the ωy axis through the laser interferometer unit 1402 is recovered. At step 1509, the drive of the fine-motion stages 1204 and 1205 through the piezoelectric actuators is allowed, and the exposure process starts.

Figure 14:
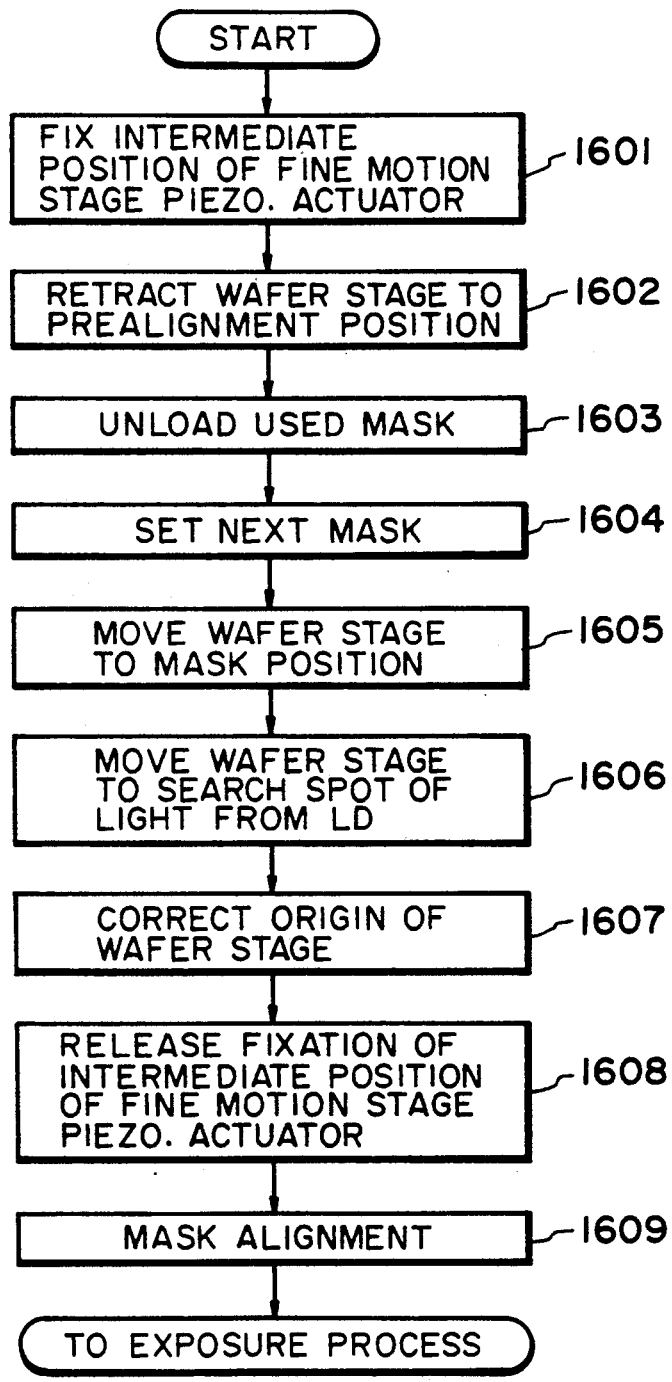
FIG. 14 is a flow chart, illustrating a mask replacement sequence in the apparatus of FIG. 9.

FIG. 14 illustrates an operational sequence of mask replacement. As illustrated, when the mask replacing operation starts, first at step 1601 the piezoelectric actuators for the fine-motion stages 1204 and 1205 of the wafer stage 1003 are held fixed. Subsequently, at step 1602, the wafer stage 1003 is retracted to the prealignment position. At step 1603, a used mask is collected and at step 1604 a fresh mask is set on the mask chuck 1105. Then, at step 1605, the wafer stage 1003 is moved back to the mask position and, at step 1606, the wafer stage 1003 is moved so as to place the PSD 1006 at a position below the spot of light projected by the LD 1007. Then, at step 1607, the correction of the origin is effected in a similar manner as has been described with reference to the wafer replacement. Then, at step 1608, the clamping of the piezoelectric actuators for the fine-motion stages 1204 and 1205 are released and, at step 1608, the relative position of the mask 1001 and the stage 1003 is adjusted so as to align an alignment mark of the mask 1001 and the reference mark 1010 of the stage 1003, for the mask alignment, on the basis of the values measured through the pickups 1102a and 1102b. Then, the orientation of a pattern formed on the mask 1001 is adjusted so as to be aligned with the orientation of the optical axes 1004a and 1004b of the laser interferometers, and thereafter the exposure process starts.

In accordance with this embodiment of the present invention, as described hereinbefore, the absolute position of the wafer stage ca be detected at the time of a start of measurement of the wafer stage position through the laser interferometer and at a time when the measurement is recovered. This accomplishes a process of wafer or mask replacement at a retracted position of the wafer stage, spaced apart from the exposure position. Therefore, replacement of a mask or a wafer can be done very easily.

Figure 16:
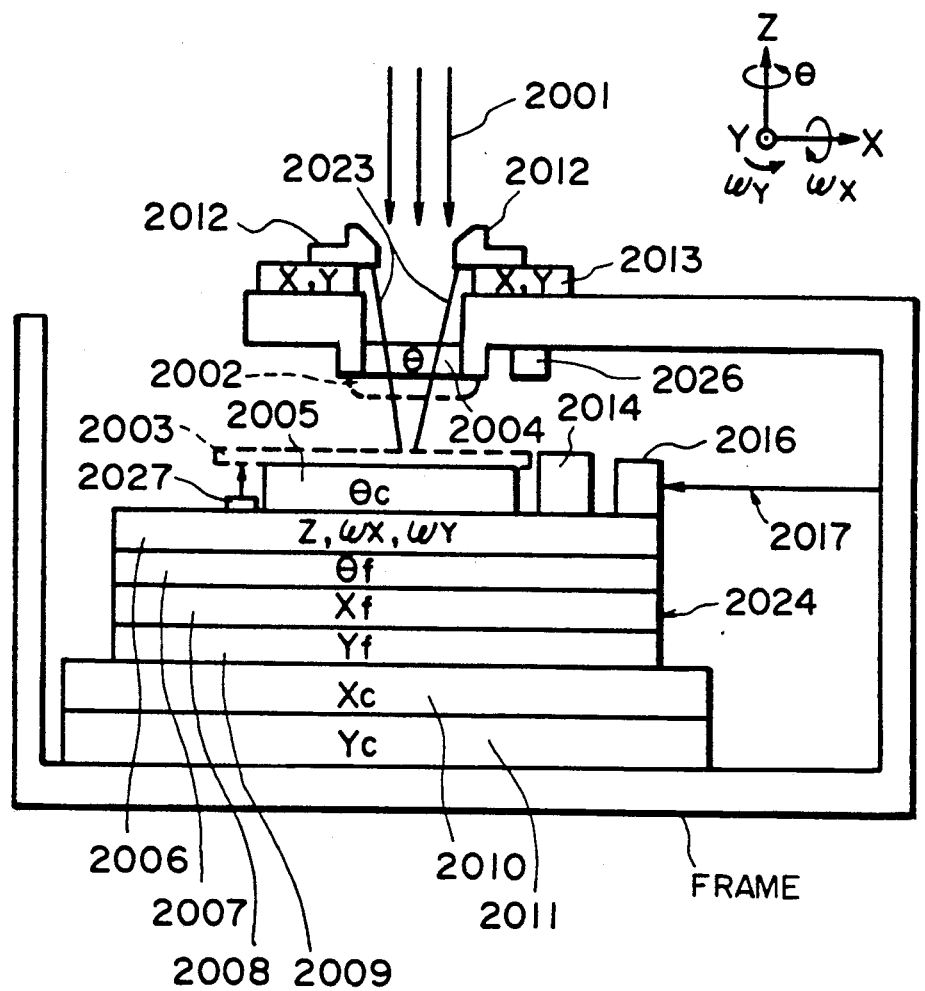
FIG. 16 is a schematic view of an exposure apparatus according to yet another embodiment of the present invention.

FIG. 16 illustrates the hardware structure of a portion of an exposure apparatus according to a further embodiment of the present invention.

In the drawing, denoted at 2003 is a wafer which is chucked by a wafer chuck (not shown) on a wafer stage 2024. Denoted at 2005 is a rough-motion θ stage rotatable in the θ direction and held by a Z tilt stage 2006. The stage 2006 is displaceable in the Z, ωx and ωy directions, and is held by a fine-motion θ stage 2007. The stage 2007 is rotatable in the θ direction and is held by a fine-motion X stage 2008. The stage 2008 is movable in the X direction and is held by a fine-motion Y stage 2009. The stage 2009 is movable in the Y direction and is held by a rough-motion X stage 2010. The stage 2010 is movable in the X direction and is held by a rough-motion Y stage 2011, the stage 2011 is movable in the Y direction and is held by a frame.

The position (X, Y) and the attitude (θ, ωx, ωy) of the stage 2024 can be measured by projecting a laser beam 2017, from a laser interferometer provided at a fixed position on the apparatus (frame), to a mirror 2016 fixed to the Z tilt stage 2006 and by receiving the reflected light from the mirror through the laser interferometer. Denoted at 2002 is a mask which is chucked by a mask chuck (not shown) on the mask θ stage 2013. The mask θ stage 2004 is rotatable in the θ direction in a plane (X-Y plane) a normal to which is codirectional with the exposure light 2001, and the stage 2004 is held by the frame.

A plurality of detection optical systems 2012 (hereinafter "pickups") are provided to measure the gap (spacing) between the mask 2002 and the wafer 2003 in the Z direction as well as any alignment error between the mask and the wafer along the X-Y plane. Particularly, the exposure apparatus of the present embodiment is equipped with four pickups. Each pickup 2012 is held by a corresponding pickup stage 2013 which is movable in the X and Y directions.

Reference numeral 2023 denotes light beams projected from the pickups 2012. Since each light beam is projected obliquely to the mask 2002, the pickups 2012 do not interfere with the exposure light 2001 during the exposure. Therefore, it is not necessary to retract the pickups 2012 from the illustrated positions, at the time of exposure.

By using the exposure light 2001, a pattern formed on the mask 2002 can be superimposingly printed on a pattern or patterns already formed on the wafer 2003. Gap sensor 2027 is provided on the Z tilt stage 2006, for execution of measurement of the bottom surface of the wafer chuck (not shown) with respect to the Z direction.

Denoted at 2014 is a light receiving element provided on the Z tilt stage 2006, and denoted at 2026 is a light projecting element which is fixedly secured to the frame and which is at a position opposed to the wafer stage 2024. The light projecting element produces and projects a light beam in the Z direction. The light receiving element 2014 serves to receive and detect each of the light beams 2023 projected from the pickups 2012 for the alignment detection as well as the light beam projected from the light projecting element 2026. As a light beam is received by the light receiving element 2014, the center position of the beam is calculated in accordance with the gravity center detecting method, for example. On the basis of the detected center position and also of the positional data of the wafer stage 2024 measured through the interferometer beam 2017, the position of the beam center can be determined precisely.

The electrical hardware structure of the present embodiment will no be explained by reference to a block diagram of FIG. 17.

In the exposure apparatus of this embodiment, all the functions are controlled under the influence of a main processor 2301, provided uppermost. The main processor 2301 communicates with various hardware units by way of a communication path 2302 and a communication interface (I/F) 2303. In FIG. 17, only those hardware units as having an alignment function, a stage controlling function and a pickup stage controlling function, are illustrated. For convenience, these hardware units will be referred to as "main-part control blocks".

As for the main-part control blocks, with regard to the alignment system, there are provided a pickup stage controller 2305 for controlling the positioning of the four pickups 2012 with respect to two axis directions (X axis and Y axis), a plurality of fine autoalignment (AA) and autofocusing (AF) controllers 2309a-2309 d, and a stage controller 2313 for controlling the positioning of each of the X and Y rough-motion stages 2010 and 2011 and the fine-motion stages 2006-2009.

Main-part control unit 2304 has appropriate programs stored therein for execution of corresponding sequences predetermined, and it controls the operation of each controller in accordance with a corresponding sequence. The control unit 2304 communicates with the prior main processor unit 2301 by way of the communication path 2302 and the communication interface 2303, for transfer of data therebetween.

Of the controllers described above, the fine AA and AF controllers 2309a–2309d and the stage controller 2313 communicate with the control unit 2304 by way of communication interfaces (2306 and 2308; 2311 and 2312) through communication path (2307; 2311), for data transfer therebetween.

Each of the controllers being communicated with the control unit 2304 through these communication paths, is equipped with a central processing unit (CPU) provided therein, such that all the hardware signal processing can be completed in each controller. With this structure, independent operation of various controllers as well as the hierarchical arrangement of the control system are attainable.

As regards the data transfer with the main-part control unit 2304, at the pickup stage controller 2305 the amount of drive of each of the four pickup stages 2013 is down-loaded.

The fine AA and AF controllers 2309a–2309d in FIG. 17 will now be explained in detail. Since the four blocks of fine AA and AF controllers 2309a–2309d have the same structure, in the following, explanation will be made to one of them.

Figure 18:
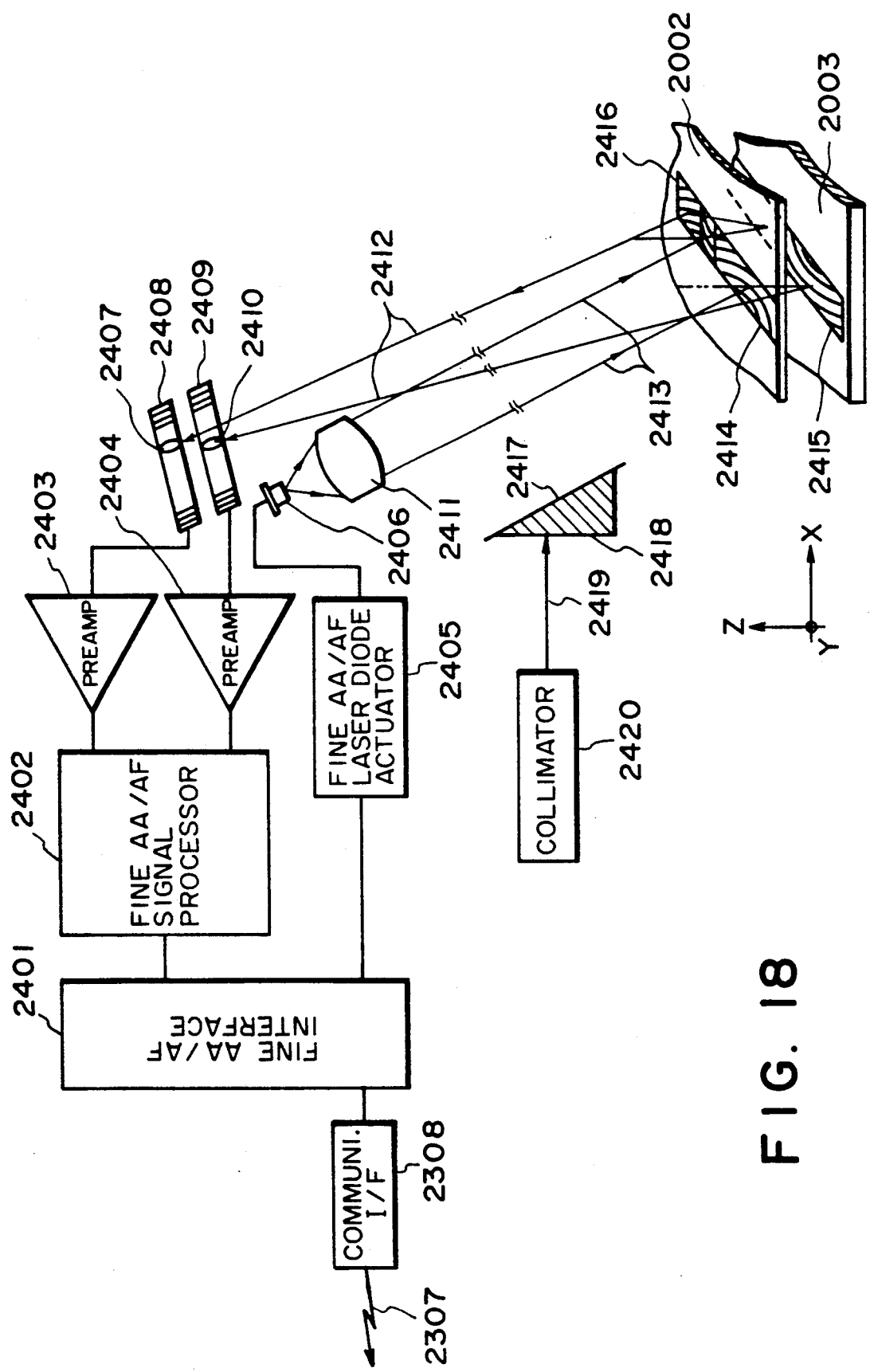
FIG. 18 is a schematic and diagrammatic view, illustrating details of a fine autoalignment (AA) and autofocusing (AF) controlling means, which is a constituent element of the arrangement shown in FIG. 17.

FIG. 18 is a schematic view showing the structure of one of the fine AA and AF controllers 2309a–2309d.

Figure 17:
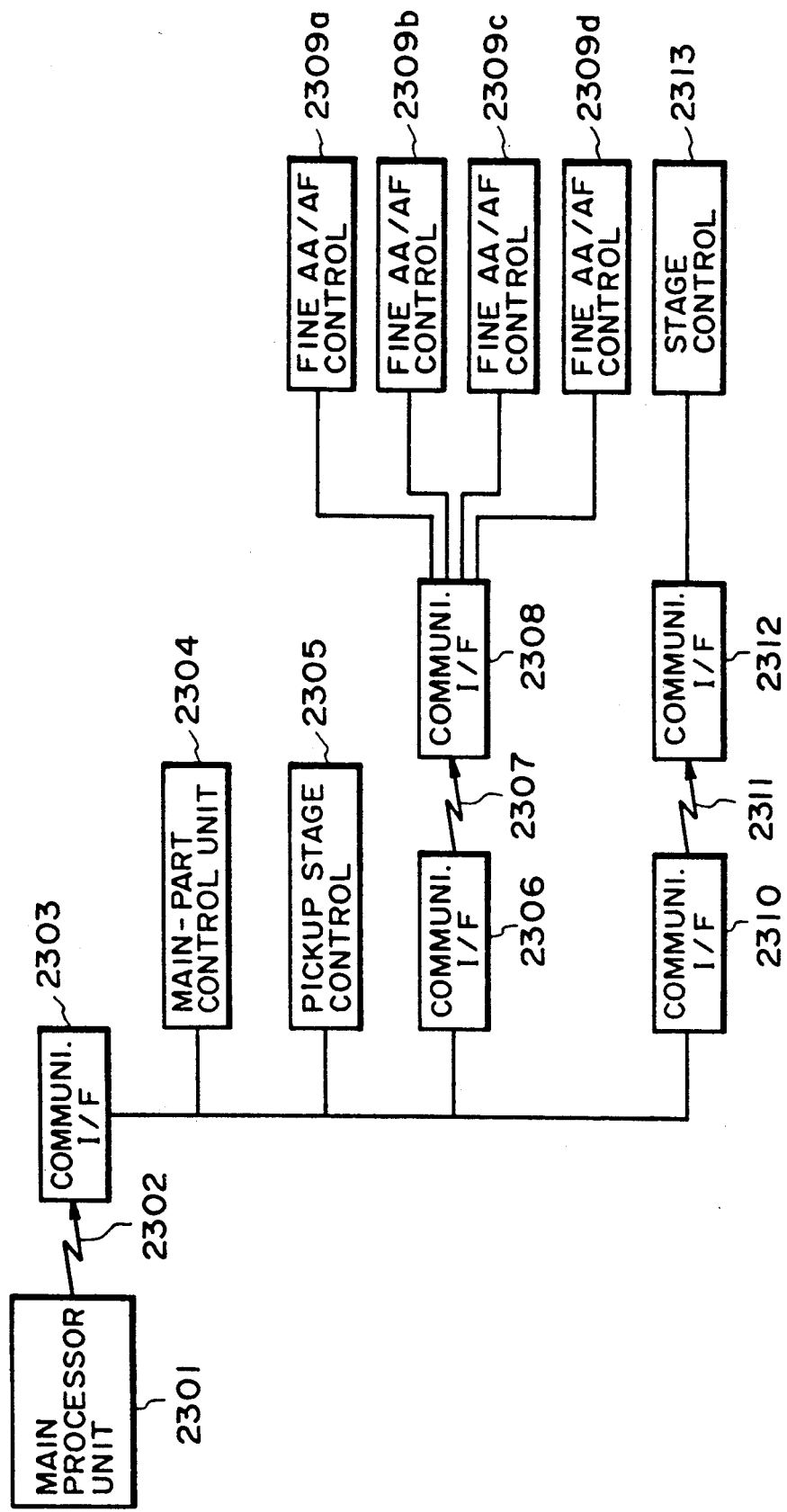
FIG. 17 is a block diagram of electrical hardware for controllably driving mechanical units shown in FIG. 16.

In the drawing, denoted at 2307 is a communication line for communication with the control unit 2304 shown in FIG. 17; at 2308 is a communication interface for receiving instructions, supplied by way of the communication line 2307, and for supplying alignment information or gap information; at 2401 is a fine AA and AF interface for receiving instructions from the communication interface 2308 and for producing a signal for alignment measurement or gap measurement and also for supplying alignment information or gap information to the communication interface 2308; at 2405 is a fine AA and AF laser diode actuator for driving the semiconductor laser 2406 at a light output as determined by the fine AA and AF interface 2401. Denoted at 2406 is a semiconductor laser (light emitting element); at 2411 is a collimator lens for transforming light produced by th semiconductor laser 2406 into parallel light; at 2413 is a projected beam outputted from the semiconductor laser 2406; at 2414 is an autofocusing (AF) mark formed on the mask 2002, together with a semiconductor circuit pattern, by a material such as gold; at 2416 is an autoalignment (AA) mark formed on the mask 2002, together with the semiconductor circuit pattern, by a material such as gold; and at 2415 is an autoalignment (AA) mark formed on the wafer 2003, together with a semiconductor circuit pattern, in the preceding exposure shot by a semiconductor process.

Denoted at 2412 are light beams, to be received, bearing alignment information and gap information obtainable through an optical system constituted by the wafer AA mark 2415, the AF mark 2414 and the wafer 2413; at 2407 is an autoalignment (AA) spot which is the light bearing the alignment information as obtainable through an optical system constituted by the mask AA mark 2416 and the wafer AA mark 2415; and at 2410 is an autofocusing (AF) spot which is the light bearing the gap information as obtainable through an optical system constituted by the mask AF mark 2414 and the wafer 2003.

Denoted at 2408 is an autoalignment (AA) sensor comprising a line sensor such as a CCD, for example, for receiving the AA spot 2407 which is the light bearing the alignment information and for converting it into an electric signal; at 2409 is an autofocusing (AF) sensor comprising a line sensor such as a CCD, for example, for receiving the AF spot 2410 which is the light bearing the gap information and for converting it into an electric signal; at 2403 is a preamplifier for amplifying the output of the AA sensor 2408 which receives the AA spot 2407 and converts it into an electric signal; and at 2404 is another preamplifier for amplifying the output of the AF sensor 2409 which receives the AF spot 2410 and converts it into an electric signal.

Denoted at 2402 is a fine AA and AF signal processor which serves to process the output of the preamplifier 2403, amplifying the output of the AA sensor 2408, to thereby calculate the alignment information. Also, it serves to process the output of the preamplifier 2404, amplifying the output of the AF sensor 2409, to thereby calculate the gap information.

In FIG. 18, the alignment information can be detected in the following manner: The fine AA and AF laser diode drive 2405 drives the semiconductor laser 2406 at a light output as set by the fine AA and AF interface 2401, more specifically, at a sufficiently large output within a range with which the AA sensor 2408 is not saturated. The light emanating from the semiconductor laser 2406 goes through the collimator lens 2411, and a projected light beam 2413 is provided. The light beam 2413 is transmitted through the mask AA mark 2416 and is reflected by the wafer AA mark 2415, whereby a light beam 2412 to be received is provided. The light beam 2412 impinges on the AA sensor 2408 in the form of the AA spot 2407.

The mask AA mark 2416 and the wafer AA mark 2415, constituting a double grating physical optic element, can transform a positional deviation between the mask 2002 and the wafer 2003 along the X-Y plane into a displacement (position) of the AA spot 2407 with an enlarging magnification of "×100", for example. The output of the AA sensor 2408 as it receives the AA spot 2407, is amplified by the preamplifier 2403 and the amplified output is inputted to the fine AA and AF signal processor 2402. The signal processor 2402 then detects the gravity center position of the AA spot 2407 incident on the AA sensor 2408. Then, while magnifying the deviation (position) of the gravity center of the AA spot at an enlarging magnification of 1:100, for example, it determines the positional deviation between the mask AA mark 2416 and the wafer AA mark 2415, namely between the mask 2002 and the wafer 2003.

Also, the gap information with respect to the Z direction can be detected in FIG. 18, in the following manner: The fine AA and AF laser diode drive 2405 drives the semiconductor laser 2406 at a light output as set by the fine AA and AF interface 2401, more specifically, at a sufficiently large light output in a range with which the AF sensor 2409 is not saturated. The light emanating from the semiconductor laser 2406 goes through the collimator lens 2414, and a projected light beam 2413 is provided. The light beam 2413 is transmitted through the AF mark 2414 and is reflected by the wafer 2003, whereby a light beam 2412 to be received is provided. The light beam 2412 the impinges on the AF sensor 2409 in the form of the AF spot 2410.

The mask AF mark 2414 which is constituted by two different grating lenses on the mask 2002, can serve to transform the surface spacing between the mask 2002 and the wafer 2003 into a magnified displacement (position) of the AF spot 2410, being magnified by an enlarging magnification of "×15", for example. The output of the AF sensor 2409 is amplified by the preamplifier 2404 and the amplified output is inputted to the fine AA and AF signal processor 2402. The signal processor 2402 then detects the gravity center position of the AF spot 2410 incident on the AF sensor 2409. Then, while magnifying the gravity center position of the AF spot 2410 at an enlarging magnification of 1:15, it determines the surface spacing between the mask AF mark 2414 and the wafer 2003, namely, between the mask 2002 and the wafer 2003.

The fine AA and AF signal processor 2402 may be provided by an analog circuit, or the output of the preamplifier 2403 or 2404 may be digitalized by an analog-to-digital converter (not shown) and then digital processed by a microcomputer, for example. Also, in response to an instruction from the main-part control unit 2304, the fine AA and AF interface can detect the alignment information or the gap information and transmit it, if required, to the main-part control unit 2304 by way of the communication interfaces 2306 and 2308 and the communication line 2307.

Denoted at 2418 is a mirror fixedly secured to the housing 2417 of the pickup 2012, for reflecting a measuring light 2419 which emanates from a collimator 2420. This mechanism has a function for detecting, from the attitude of the housing 2417 of the pickup 2012, the position and the angle of incidence upon the mask 2002 of the projected light beam 2413 from the pickup 2012, at the time of alignment measurement. The controlling and detecting function of the collimator 2420 is included in the pickup stage controller 2305 which is to be described below in detail.

Figure 19:
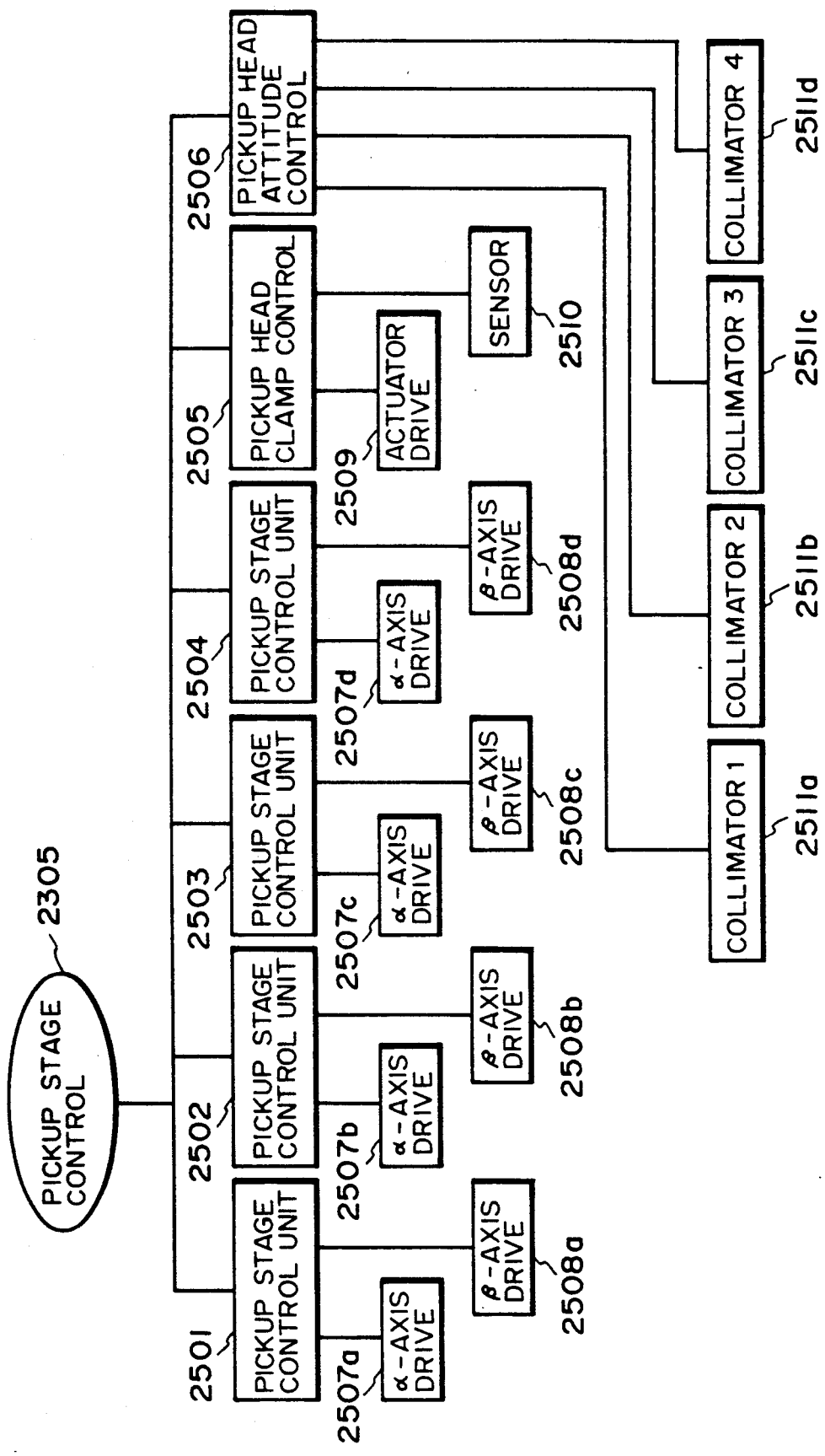
FIG. 19 is a block diagram, illustrating details of a pickup stage controlling means, which is a constituent element of the arrangement shown in FIG. 17.

FIG. 19 illustrates electrical blocks for controlling α direction (X direction) actuator units and β direction (Y direction) actuator units of the pickup stages 2013 shown in FIG. 16, electrical blocks for controlling the mechanical clamping of the pickups 2012, and measuring units for executing attitude measurement of the pickups 2012.

Referring to FIG. 19, the pickup stage controller 2305 of FIG. 17 comprises pickup stage control units 2501-2504 (for the four pickups), a pickup head clamp control means 2505 and a pickup head attitude measuring means 2506. The pickup stage control units 2501-2504 have a function for outputting the number of pulses corresponding to the moving distance, to α-axis drives 2507a-2507d and β-axis drives 2508a-2508d which are the drivers of the α direction actuator units and the β direction actuator units, as well as a function for setting the timing of pulse emission in accordance with a target position as transmitted from the main-part control unit 2304, in the form of a trapezoidal drive pattern not imparting any impact to the pickup 2012.

The α-axis drives 2507a-2507d and the β-axis drives 2508a-2508d each comprises a driver for a DC motor, and in response to an instruction from the main-part control unit 2304 the gain of the servo loop can be reduced to zero, if desired. The pickup head clamp control means 2505 comprises a drive 2509 of an actuator to be used to press a portion of the housing 2417 of the pickup 2012 against a pickup reference surface (not shown) which is a super flat surface, in order to suppress any error of position control due to the pitching or rolling of the pickup 2012. Also, the clamp control 2505 further comprises sensor means 2510 provided to discriminate the state of contact to the pickup reference surface. As regards the sensor means, each pickup stage is equipped with a sensor for the state discrimination, and the sensor means 2510 has inputs of a total of four channels.

Each pickup 2012 is equipped with a collimator 2511 (2420 in FIG. 18), and the pickup head attitude measuring means 2506 is operable to calculate any error in the position of incidence and the angle of incidence of the projected light beam 2413 on the basis of the data obtained through the collimator 2511, and to supply the result of the calculation to the main-part control unit 2304. On the basis of the thus detected error, it is possible to execute an appropriate processing to cancel any error in the measurement through the pickup 12 for the auto alignment of the mask 2002 and the wafer 2003, to be produced when the projected light beam 2413 is not incident on a desired position at a desired angle.

Figure 20:
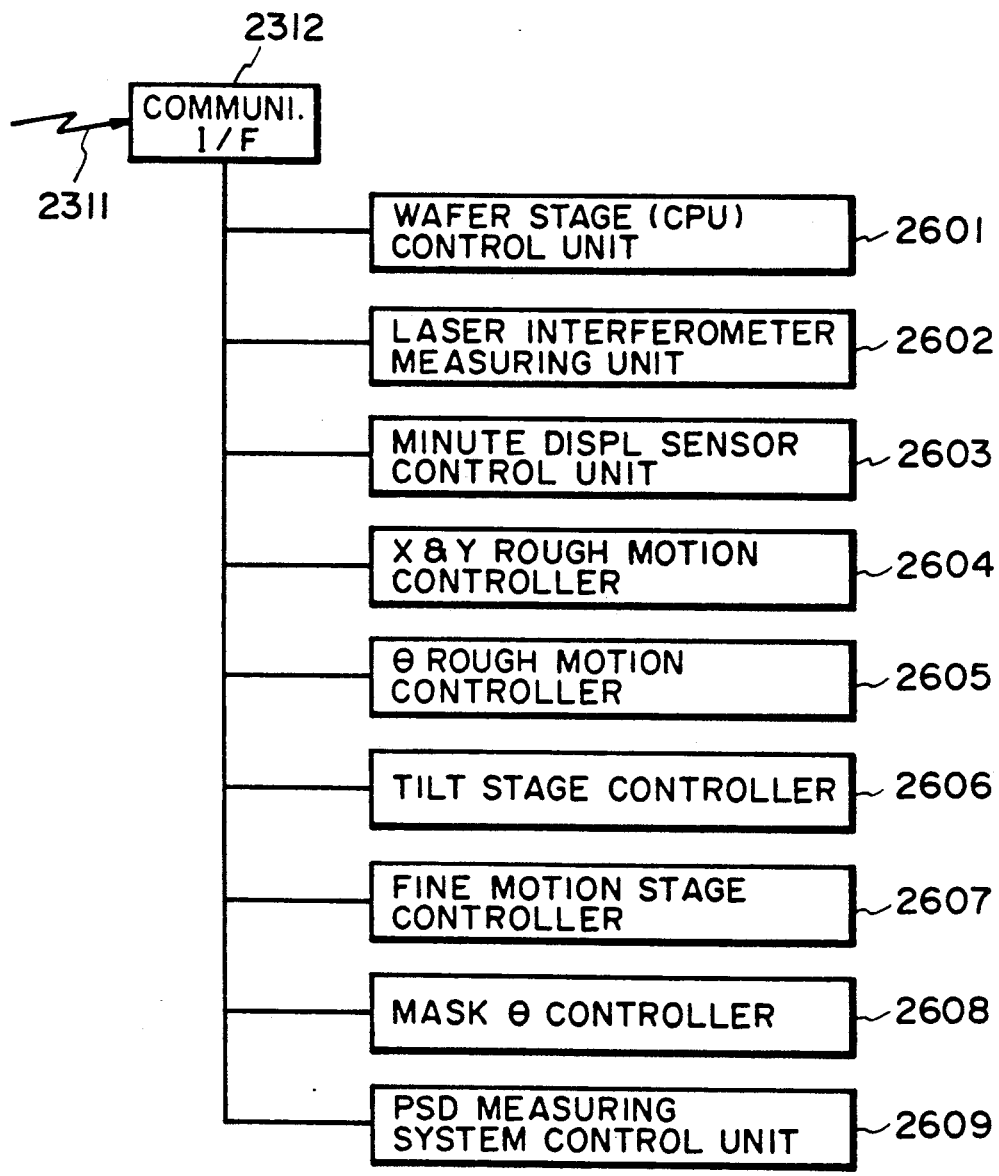
FIG. 20 is a block diagram, illustrating details of a stage controlling means, which is a constituent element of the arrangement shown in FIG. 17.

FIG. 20 is a block diagram, illustrating details of the stage controller 2313 shown in FIG. 17. Between this unit and the main-part control unit 2304, information can be transferred by way of the communication interfaces 2310 and 2312 and through the communication path 2311. Wafer stage control unit 2601 is equipped with a CPU (not shown) provided therein, and is operable to calculate the amount of drive of each actuator accommodated in the wafer stage 2024, in accordance with a desired or target position of the stage as supplied from the control unit 2304. Also, it has a processing function for converting the data supplied from a PSD measuring system control unit 2609 which receives a signal produced by a light receiving sensor (PSD) 2014 on the wafer stage 2024, into corresponding positional data. Laser interferometer measuring unit 2602 serves to execute the position measurement with respect to five axes, excluding an axis (Z axis) which is in the direction of a normal to the wafer surface. Minute-displacement sensor control unit 2603 serves to measure the amount of Z axis displacement of the rough-motion θ stage 2005 by execution of driving and signal processing for the minute-displacement sensor 2027.

X-Y rough-motion controller 2604 serves to control electric cylinders of the rough-motion X stage 2010 and the rough-motion Y stage 2011 in FIG. 16. Reference numeral 2605 denotes a θ rough-motion controller. As illustrated in FIG. 16, the θ rough-motion axis (rough-motion θ stage 2005) rides on the X and Y drive axes (stages 2008, 2009, 2010 and 2011), the Z, ωx and ωy drive axes (stage 2006) and the θ fine-motion axis (stage 2007). Any change in the position of the wafer stage 2024 resulting from displacement of the θ rough-motion axis (rough-motion θ stage 2005) is not reflected to the motion of the mirror 2016, for reflecting light 2017 from the interferometer. For this reason, in the present embodiment, an inchworm actuator is used as an actuator for the θ rough-motion axis 2005, whereby any change in the position of the rough-motion θ stage 2005 after the θ axis rough alignment can be prohibited. Tilt stage controller 2606 serves to control the position of the tilt stage 2006, placed on the X and Y drive axes 2008-2011 and the θ fine-motion axis 2007, in accordance with an instruction from the wafer stage control unit 2601. Fine-motion stage controller 2607 serves to control the minute-displacement actuators for the fine-motion X and Y axes 2008 and 2009. Mask θ controller 2608 serves to control the mask θ fine-motion stage 2608 serves to 2004 carried on the mask stage.

Figure 21:
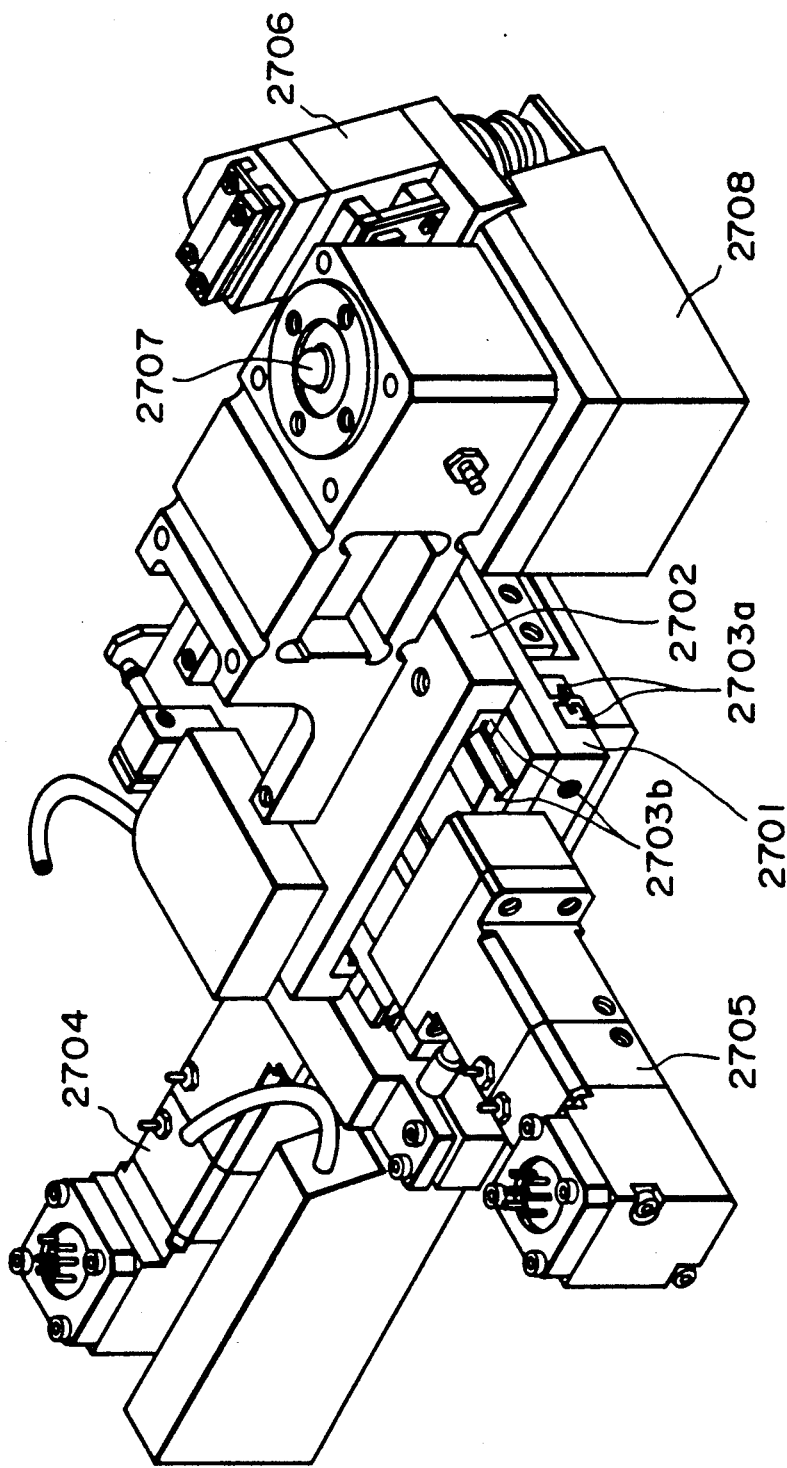
FIG. 21 is a perspective view showing the mechanical structure of a pickup and a pickup stage, which are constituent elements of the arrangement shown in FIG. 16.

FIG. 21 is a perspective view, illustrating one pickup 2012 and one pickup stage 2013, of the present embodiment. In the drawing, denoted at 2701 is an α-axis stage which is guided by an α-axis cross roller guide 2703a, and denoted at 2702 is a β-axis stage guided by a β-axis cross roller guide 2703b. These two stages 2701 and 2702 are position-controlled by means of actuators 2704 and 2705 with encoders, respectively. Reference numeral 2707 denotes a push rod for the pickup head clamping. When the push rod 2707 is moved to be protruded, by the reaction of an urging force of the push rod 2707 against an abutment (not shown), the pickup head 2708 to which a barrel 2706, having a fine AA and AF optical system accommodated therein, is pressed against the super flat surface (not shown).

Figure 22:
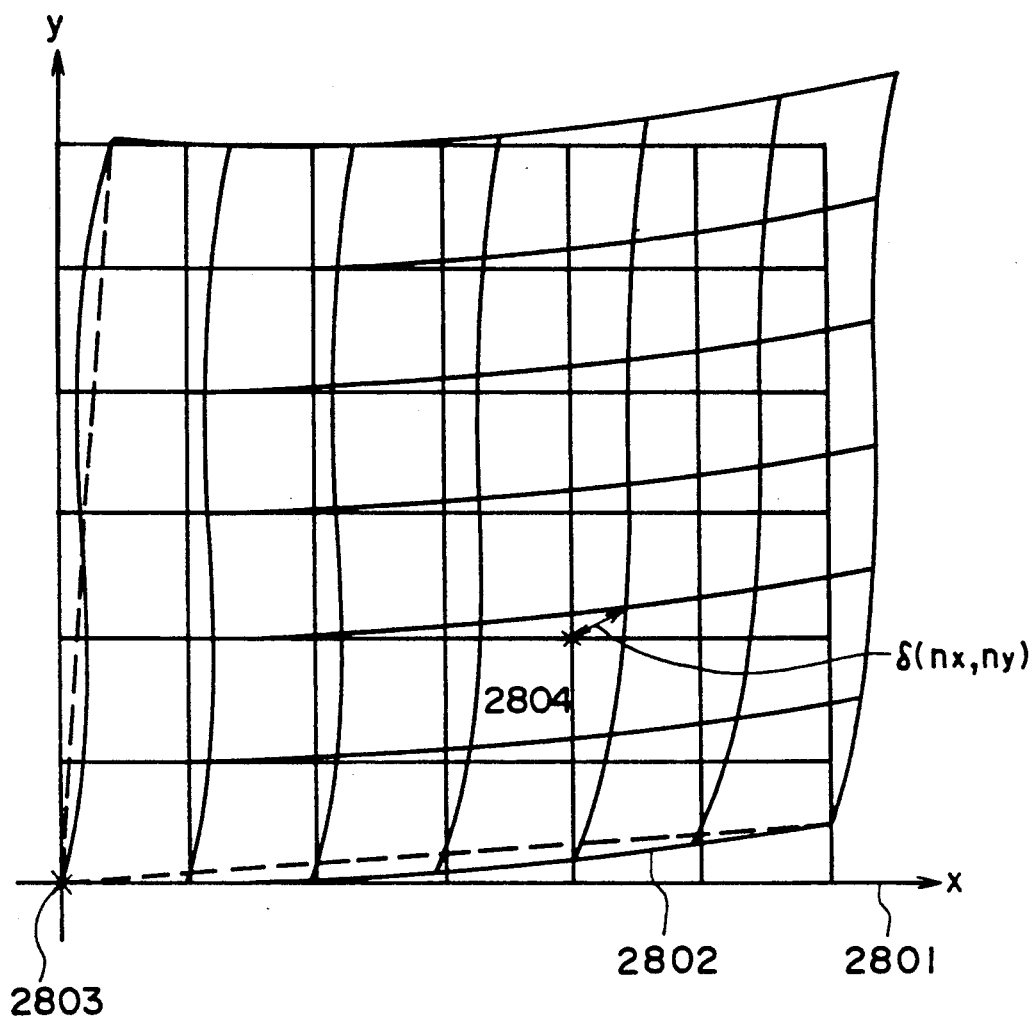
FIG. 22 is a representation of a coordinate plane of a particular pickup, in comparison with an orthogonal coordinate system as determined by laser interferometers.
Figure 23:
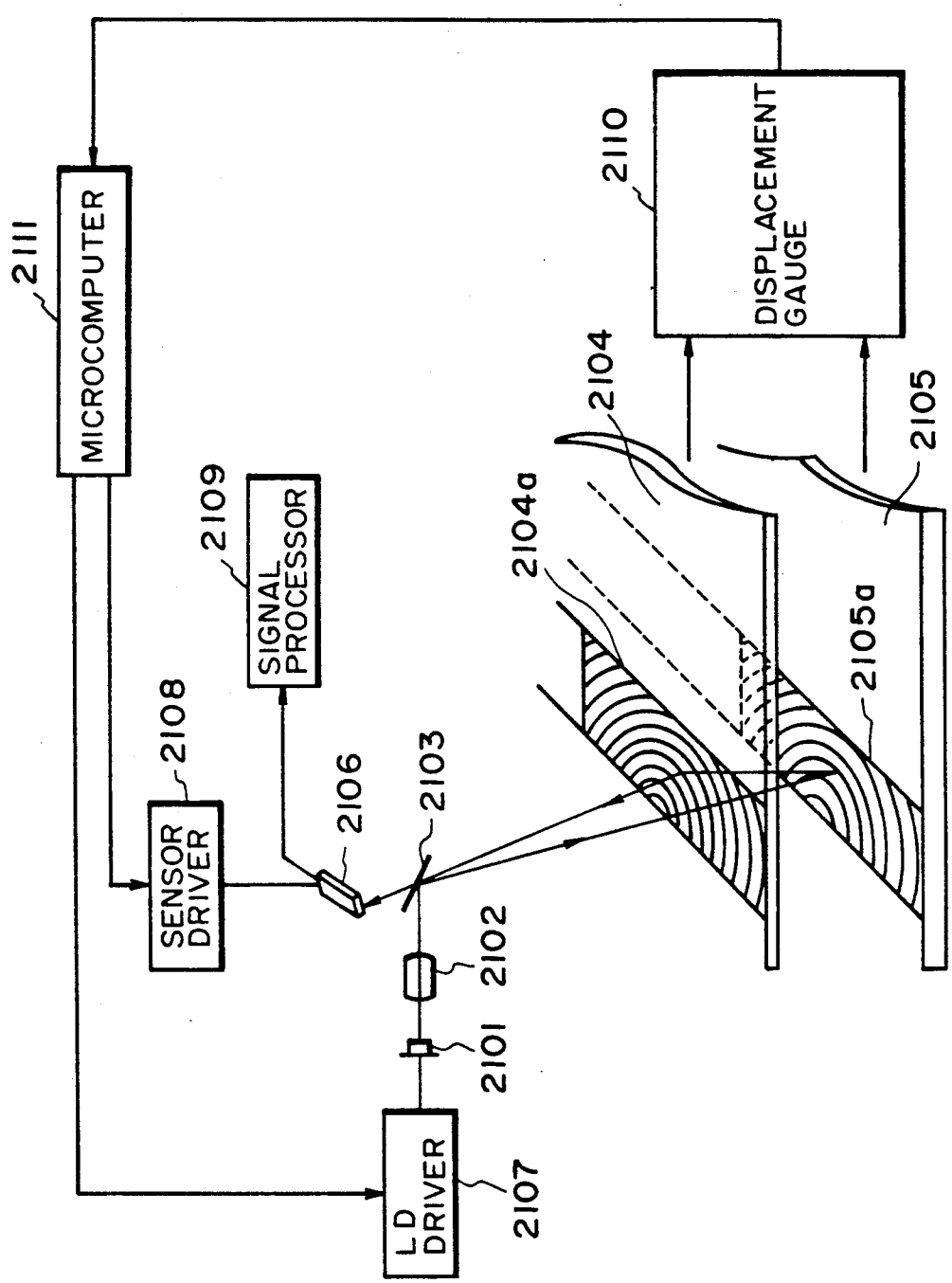
FIG. 23 is a schematic view of a mask-to-wafer alignment measuring optical system which uses diffraction gratings.

FIG. 22 is a representation of a coordinate system 2802 provided by the encoder and the like of the pickup stage 2013, when the optical axes in the X and Y directions of the laser interferometer system (measuring optical system) of the wafer stage 2024 are considered as an orthogonal coordinate system 2801, wherein the coordinate system 2802 is illustrated as being projected to the orthogonal coordinate system 2801 provided by the interferometer system. In the pickup stage 2013, due to any distortion of the cross roller guide 2703, to the "out of roundness" of the cross roller (not shown) or to any other factor, there is a possibility that, even when the origin 2803 is accordant with the coordinate system 2801 provided by the interferometer system, an error δ occurs at an arbitrary point 2804 spaced apart from the origin. Among these errors δ, those having reproducibility can constitute a coordinate system 2802 such as illustrated in FIG. 22. Accordingly, if the conversion of a coordinate system between the pickup stage 2013 and the wafer stage 2024 is attained, then it is possible to more accurately control the spot position of the projected light beam 2413 from the pickup 2012, with respect to the alignment mark 2414 or 2416 on the mask 2002, as controlled by the wafer stage side coordinate system 2801.

Figure 15:
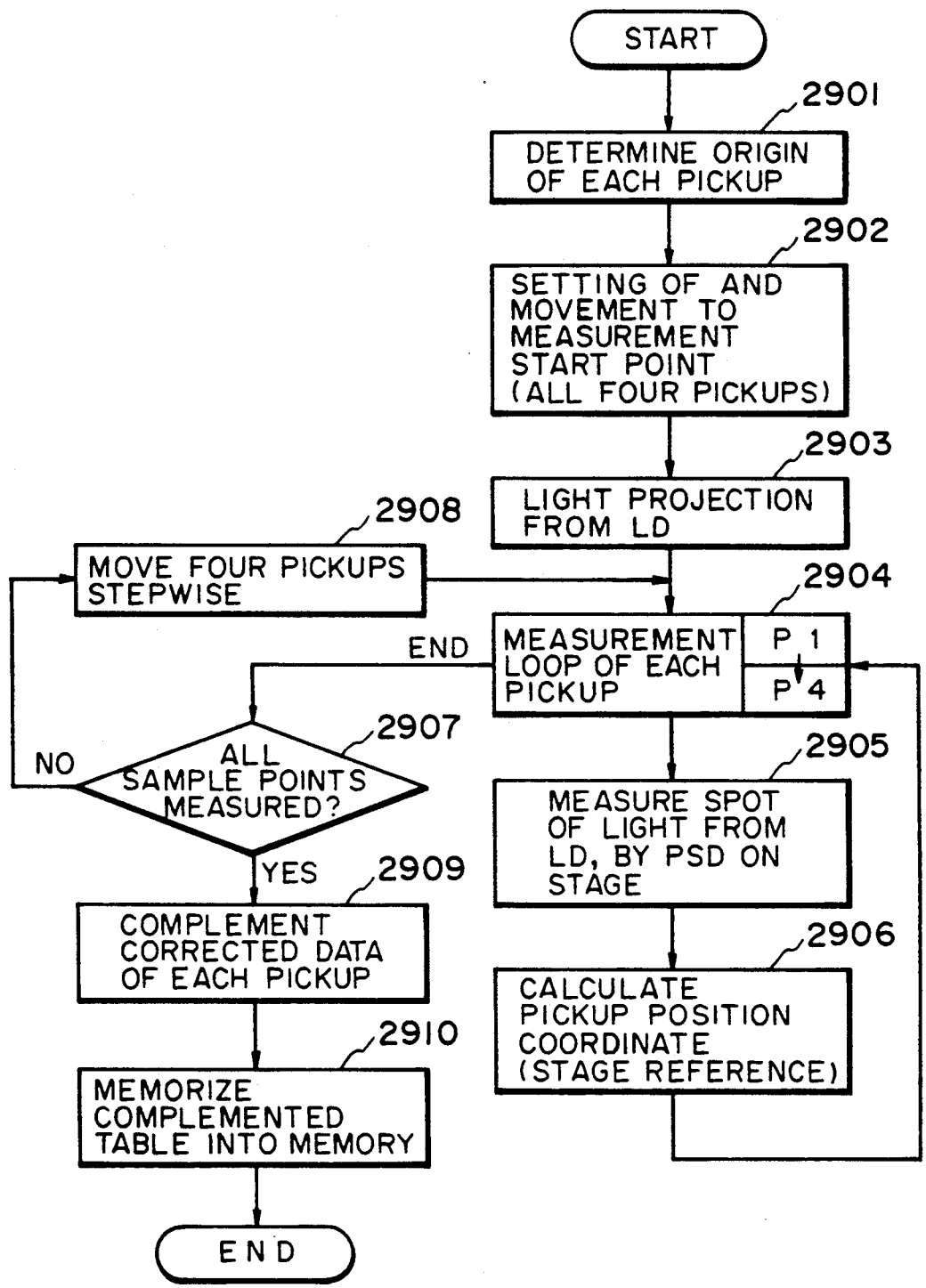
FIG. 15 is a flow chart, illustrating a sequence, in an exposure apparatus according to a further embodiment of the present invention, for preparing a table for coordinate conversion between a pickup stage and a wafer stage.

Referring now to FIG. 15, there is shown a sequence for preparing a conversion table for converting a coordinate system, inherent to an associated pickup, into an orthogonal coordinate system as defined by the laser interferometer system (i.e. coordinate conversion between the pickup stage and the wafer stage).

First, at step 2901 the origin of each pickup 2012 is determined. Thereafter, at step 2902, each pickup stage 2013 is moved to move a corresponding pickup 2012 to the sampling data measuring point for preparation of the conversion table. At step 2903, the LD 2406 for alignment measurement is attached so that a light beam 2413 is projected to the PSD 2014 on the wafer stage 2024. At steps 2904-2906, the wafer stage 2024 is moved to displace the PSD 2014 along the X-Y plane, so as to determine such a position of the wafer stage at which the projected light beam from each pickup 2012 impinges at a predetermined site on the light receiving surface of the PSD 2014. These positions are measured by using the interferometer measuring unit 2602. Since details have been described with reference to FIG. 8, explanation will not be repeated here. In the present embodiment, four pickups 2012 are used. Therefore, the beam position measurement at step 2905 and the pickup position coordinate calculation at step 2906 are effected each time one pickup stage 2013 is moved. Accordingly, each of the steps 2905 and 2906 is executed four times, totally. At step 2906, the pickup 2012 is moved to a predetermined position in accordance with the coordinate system 2802 (see FIG. 22) of the stage side and, when the pickup reaches such a predetermined position, the position with respect to the coordinate system 2801 of the wafer stage side that corresponds to the predetermined position in the coordinate system 2802 is discriminated. For example, a difference $\delta$ ($n_x$, $n_y$) is calculated.

At step 2907, discrimination is made as to whether all the sampling data measurements with regard to all the pickup stages 2013 have been completed or not. Until all the measurements are completed, each pickup 2012 is moved stepwise by a predetermined amount by means of the stage 2013 (step 2908), and the subsequent measurement routine is carried out at steps 2904-2906. When completion of all the sample data measurements is discriminated at step 2907, the CPU of the main-part control unit 2304 executes complementing calculation (step 2909) in relation to each of the pickup stages 2013, on the basis of the obtained data, and prepares a complementary table related to the whole moving region of the stage 2013. Such a complementary table is memorized into a memory of the main-part control unit 2304 (step 2910) and, during execution of an ordinary sequence, it is referred to when a pickup 2012 is going to be driven.

Figure 24:
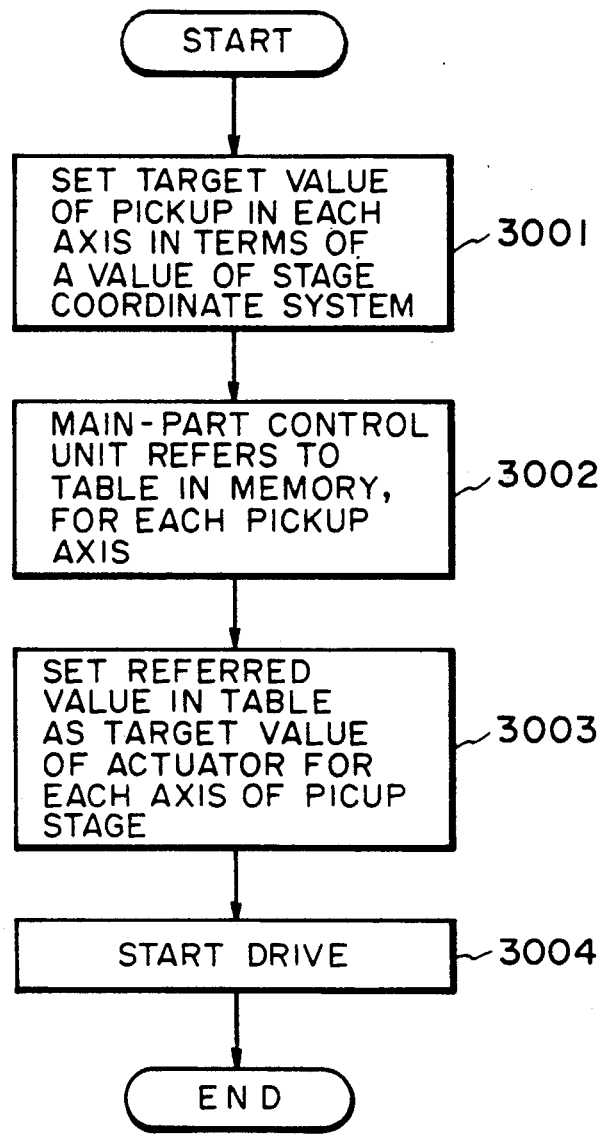
FIG. 24 is a flow chart, illustrating a sequence of processing for displacing each pickup axis along a coordinate system as determined by a laser interferometer.

This process will be explained by reference to the flow chart of FIG. 24. The position of incidence of each projected light beam 2413 as produced from a corresponding pickup 2012 can be defined by the coordinate system 2801 (FIG. 21) based on the optical axis of the laser interferometer unit 2602, carrying out the measurement of the position of the stage 2024 (step 3001). Each value as defined by this coordinate system 2801 is converted into a target value with respect to the coordinate system 2802 (FIG. 21) of a corresponding pickup stage 2013 in accordance with a corresponding table having been prepared in relation to a corresponding pickup 2012 (step 3002). These target values are set as the target values for the respective pickup stage control units 2501-2504 (step 3003) and, at the subsequent step 3004, a drive start instruction is outputted.

In accordance with this embodiment of the present invention, as described hereinbefore, it is possible to determine, correctly and quickly, the position of a projected light beam for alignment measurement as supplied from an alignment optical system. Also, it is possible to reduce any error in the alignment measurement to be caused by a change in the position or attitude of the alignment optical system.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for printing a pattern of a mask on a wafer, said apparatus comprising:
   a mask chuck for holding the mask;
   a mask stage for moving said mask chuck;
   a wafer chuck for holding the wafer;
   a wafer stage for moving said wafer chuck along a stage coordinate system;
   a photoelectric detector, movable integrally with said wafer chuck when said wafer chuck is moved by said wafer stage, for receiving a light beam and for producing an output;
   a light emitting element, movable integrally with said mask chuck when said mask chuck is moved by said mask stage, for projecting a light beam toward said photoelectric detector; and
   control means for processing an output of said photoelectric detector produced when said mask chuck is moved by said mask stage, to detect a change in position of the mask based on positional information related to the coordinate system of said wafer stage, and for controlling movement of said wafer stage for positioning the wafer by said wafer chuck on the basis of the obtained position information.

2. An apparatus according to claim 1, wherein said control means comprises means for producing the position information as a data table.

3. An exposure apparatus for printing a pattern of a mask on a wafer, said apparatus comprising:
   a mask chuck for holding the mask;
   a mask stage for moving said mask chuck;
   a wafer chuck for holding the wafer;
   a wafer stage for moving said wafer chuck along a coordinate system;
   laser interferometric distance measuring means for producing data related to a change in position of said wafer chuck in the coordinate system when said wafer chuck is moved by said wafer stage;
   a photoelectric detector, movable integrally with said wafer chuck when said wafer chuck is moved by said wafer stage, for receiving a light beam and for producing an output;
   a frame member for supporting said mask stage and said wafer stage;
   a light emitting element fixed to and provided integrally with said frame member, for projecting a light beam toward said photoelectric detector to form a light spot at a position which is immovable with respect to the coordinate system; and
   correcting means for correcting the data produced by said distance measuring means, on the basis of the output produced by said photoelectric detector in response to receiving the light beam.

4. An apparatus according to claim 3, wherein said mask chuck holds the mask and said wafer chuck holds the wafer such that the mask and wafer oppose each other with a small space maintained therebetween, when the pattern of the mask is printed on the wafer.

5. An apparatus according to claim 3, wherein said light emitting element projects the light beam toward said photoelectric detector free from intervention of the mask.

6. An exposure apparatus for printing a pattern of a mask on a wafer, said apparatus comprising:
   a mask chuck for holding the mask;
   a wafer chuck for holding the wafer;
   a wafer stage for moving said wafer chuck along a stage coordinate system;
   an alignment detecting optical system for projecting a light beam for alignment of the mask and the wafer;
   a photoelectric detector for receiving the light beam and for producing an output;
   a movable stage for moving said alignment detecting optical system so that said photoelectric detector receives the light beam from said alignment detecting optical system each time said alignment detecting optical system is moved to a different position by said movable stage; and control means for processing outputs of said photoelectric detector produced successively in response to receiving the light beam from said alignment detecting optical system being moved by said movable stage to different positions, to detect a change in position, caused by movement of said alignment detecting optical system, of a light spot formed by the light beam in terms of positional information related to the coordinate system of said wafer stage, and for controlling movement of said alignment detecting optical system by said movable stage based on the obtained position information.

7. An apparatus according to claim 6, further comprising a plurality of alignment detecting optical systems associated with said photoelectric detector.

8. An apparatus according to claim 6, wherein said control means comprises memory means for memorizing the position information as a data table.

9. An alignment method usable in an exposure apparatus for printing a pattern of a mask on a wafer placed on a wafer chuck movable along a predetermined coordinate system, said method comprising the steps of:
providing a movable alignment detecting optical system for projecting a light beam for alignment of the mask and the wafer;
providing a photoelectric detector integrally with the wafer chuck for receiving the light beam;
moving the alignment detecting optical system to a first position;
moving the wafer chuck along the predetermined coordinate system so that the photoelectric detector receives the light beam from the alignment detecting optical system;
displacing the alignment detecting optical system to a next position;
processing an output of the photoelectric detector produced in response to receiving the light beam from the alignment detecting optical system when the alignment detecting optical system is displaced and detecting a change in position of a light spot formed by the light beam resulting from the displacement of the alignment detecting optical system, in terms of position information related to the predetermined coordinate system;
memorizing the obtained position information;
moving and positioning the alignment detecting optical system to effect alignment of the mask and the wafer based on the memorized positional information; and
aligning the mask and the wafer using the positioned alignment detecting optical system and using a light beam from the alignment detecting optical system.

10. In a method of manufacturing semiconductor devices by using an exposure apparatus for printing a pattern of a mask on a wafer, wherein the exposure apparatus includes a mask chuck for supporting the mask and being movable by a mask stage, a wafer chuck for supporting the wafer and being movable by a wafer stage, the improvement comprising the steps of:
providing a light emitting element for emitting a light beam and being movable integrally with the mask chuck when the mask chuck is moved by the mask stage;
providing a photoelectric detector movable integrally with the wafer chuck when the wafer chuck is moved by the wafer stage;
moving the mask chuck through the mask stage successively to different positions;
detecting, through the photoelectric detector, the light beam from the light emitting element each time the mask chuck is moved to a different position, such that the photoelectric detector produces a plurality of measurement data;
detecting, on the basis of the plurality of measurement data, a change in position of the mask caused in response to movement of the mask chuck, in terms of positional information related to a stage coordinate system; and
controlling, on the basis of the positional information, the movement of the wafer chuck through the wafer stage for printing the pattern of the mask on a zone of the wafer.

11. In a method of manufacturing semiconductor devices by using an exposure apparatus for printing a pattern of a mask on a wafer, wherein the exposure apparatus includes a mask stage for supporting and moving the mask and being supported by a frame member, a wafer chuck for supporting the wafer and being movable by a wafer stage, and laser interferometric distance measuring means including a mirror integrally movable with the wafer chuck when the wafer chuck is moved by the wafer stage, for measuring a change in position of the mirror with respect to a coordinate system of the wafer stage, the improvement comprising the steps of:
providing a light emitting element in a fixed positional relation on the frame member;
providing a photoelectric detector movable integrally with the wafer chuck when the wafer chuck is moved by the wafer stage;
moving the wafer chuck through the wafer stage;
causing the laser interferometric distance measuring means to measure a change in position of the mirror, during movement of the wafer chuck, through the wafer stage;
detecting, through a photoelectric detector, a light beam emitted from the light emitting element; and
correcting a measured value of the laser interferometric distance measuring means, on the basis of the detection of the light beam through the photoelectric detector, for correct printing of the pattern of the mask on a zone of the wafer.

12. In a method of manufacturing semiconductor devices by using an exposure apparatus for printing a pattern of a mask on a wafer, wherein the exposure apparatus includes an alignment detecting optical system for supplying a light beam and being movable by a movable stage, and a wafer chuck for supporting the wafer and being movable by a wafer stage, the improvement comprising the steps of:
providing a photoelectric detector movable integrally with the wafer chuck when the wafer chuck is moved by the wafer stage;
moving the alignment detecting optical system through the movable stage successively to different positions;
detecting, through the photoelectric detector, the light beam from the alignment detecting optical system each time the alignment detecting optical system is moved to a different position, such that the photoelectric detector produces a plurality of measured values;
detecting, on the basis of the produced plurality of measured values, a change in position of the light beam caused in response to movement of the alignment detecting optical system; and
controlling, on the basis of the detection of the change in position of the light beam, movement of the alignment detecting optical system through the movable stage, for correct printing of the pattern of the mask on a zone of the wafer.

* * * * *

UNITED STATES PATENT AND TRADEMARK OFFICE
CERTIFICATE OF CORRECTION

PATENT NO. : 5,182,615

DATED : January 26, 1993

INVENTOR(S) : Hiroshi Kurosawa, et al.

It is certified that error appears in the above-identified patent and that said Letters Patent is hereby corrected as shown below:

On drawing sheet

FIG. 24

In logic block 3003, "PICUP" should read --PICKUP--.

COLUMN 1

Line 34, "such" should read --such a--;
Line 64, "particularly" should read --particular--; and
Line 68, "requirement" should read --requirements--.

COLUMN 4

Line 16, "degree" should read --degrees--.

COLUMN 6

Line 12, "is is" should read --is--.

COLUMN 8

Line 64, "direction" should read --directions--.

COLUMN 9

Line 50, "denotes" should read --denotes a--.

UNITED STATES PATENT AND TRADEMARK OFFICE
CERTIFICATE OF CORRECTION

PATENT NO. : 5,182,615
DATED : January 26, 1993
INVENTOR(S) : Hiroshi Kurosawa, et al.

It is certified that error appears in the above-identified patent and that said Letters Patent is hereby corrected as shown below:

COLUMN 10

Line 27, "follows: (i) As regards the three" should read --follows:
¶ (i) As regards the three--.

COLUMN 11

Line 31, "actuated," should read --activated,--.

COLUMN 12

Line 20, "function" should read --functions--; and
Line 45, "denotes" should read --denote--.

COLUMN 17

Line 47, "no" should read --now--.

COLUMN 18

Line 12, "2311" should read --2310--.

COLUMN 20

Line 1, "the impinges" should read --then impinges--; and
Line 63, "comprises" should read --comprise--.

UNITED STATES PATENT AND TRADEMARK OFFICE
CERTIFICATE OF CORRECTION

PATENT NO. : 5,182,615

DATED : January 26, 1993

INVENTOR(S) : Hiroshi Kurosawa, et al.

It is certified that error appears in the above-identified patent and that said Letters Patent is hereby corrected as shown below:

COLUMN 21

Line 21, "auto alignment" should read --autoalignment--.

COLUMN 22

Line 3, "2608 serves to" should be deleted; and
    Line 56, "attached" should read --activated--.

COLUMN 25

Line 11, "position" should read --positional--;
    Line 17, "position" should read --positional--;
    Line 37, "displaced" should read --displaced,--;
    Line 40, "position" should read --positional--; and
    Line 42, "position" should read --positional--.

Signed and Sealed this

First Day of March, 1994

Attest:

BRUCE LEHMAN

Attesting Officer     Commissioner of Patents and Trademarks